US007791446B2

(12) United States Patent
Fujii et al.

(10) Patent No.: US 7,791,446 B2
(45) Date of Patent: Sep. 7, 2010

(54) INDUCTOR DEVICE AND METHOD OF MANUFACTURING THE SAME

(75) Inventors: Tomoharu Fujii, Nagano (JP); Masahiro Sunohara, Nagano (JP); Manabu Nakamura, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 0 days.

(21) Appl. No.: 12/186,317

(22) Filed: Aug. 5, 2008

(65) Prior Publication Data

US 2009/0039999 A1 Feb. 12, 2009

(30) Foreign Application Priority Data

Aug. 6, 2007 (JP) .............................. 2007-204325

(51) Int. Cl.
*H01F 5/00* (2006.01)

(52) U.S. Cl. ..................................... 336/200
(58) Field of Classification Search ................. 336/65, 336/83, 200, 232, 206–208; 257/531
See application file for complete search history.

(56) References Cited

U.S. PATENT DOCUMENTS 7,626,480 B2 * 12/2009 Lee ............................ 336/200

FOREIGN PATENT DOCUMENTS

JP 11251143 A * 9/1999
JP 2005-79286 3/2005

* cited by examiner

*Primary Examiner*—Tuyen Nguyen
(74) *Attorney, Agent, or Firm*—Drinker Biddle & Reath LLP

(57) ABSTRACT

An inductor device formed on a semiconductor substrate includes an inductor body penetrating the semiconductor substrate, taking a spiral shape and having a conductivity, and an insulating film provided between a side surface of the inductor body and the semiconductor substrate.

3 Claims, 24 Drawing Sheets

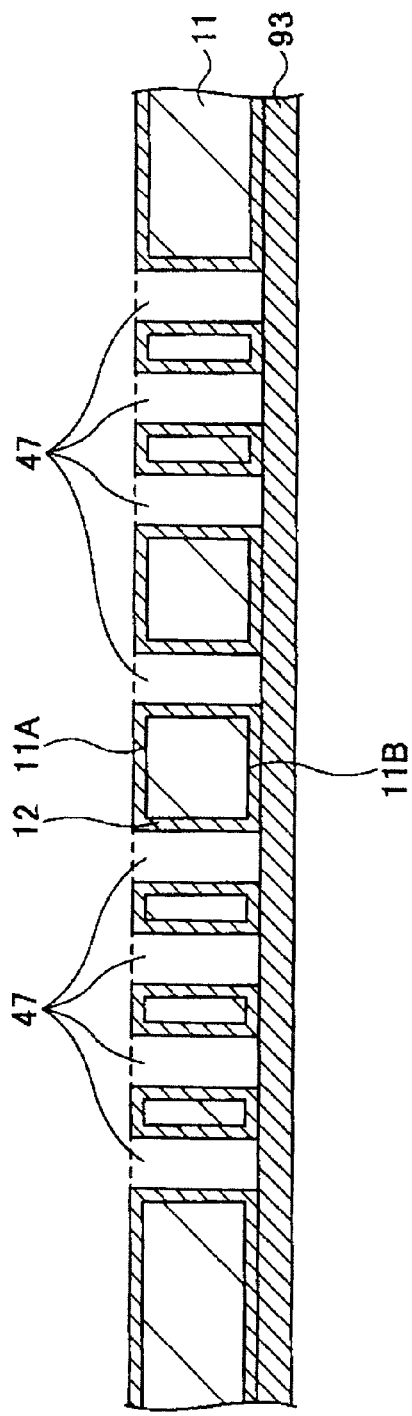
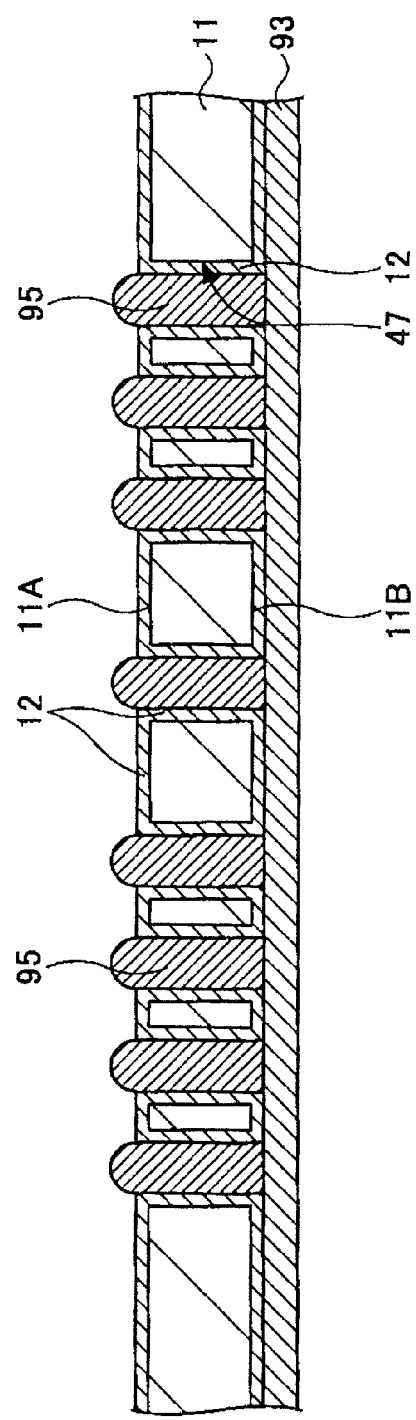

INDUCTOR DEVICE AND METHOD OF MANUFACTURING THE SAME

TECHNICAL FIELD

The present disclosure relates to an inductor device and a method of manufacturing the inductor device, and more particularly to an inductor device formed on a semiconductor substrate and a method of manufacturing the inductor device.

RELATED ART

In some high frequency modules and voltage converting modules which are used in a portable information communicating apparatus and a radio LAN (Local Area Network), an inductor device (see FIG. 1) is formed on a semiconductor substrate to reduce a size of the module.

FIG. 1 is a sectional view showing a related-art inductor device.

With reference to FIG. 1, a related-art inductor device has insulating films 202 and 205, an inductor body 203, and wiring patterns 206 and 207. The insulating film 202 is provided on an upper surface of a semiconductor substrate 201. The insulating film 202 serves to insulate the semiconductor substrate 201 from the inductor body 203.

FIG. 2 is a plan view showing the inductor body illustrated in FIG. 1.

With reference to FIGS. 1 and 2, the inductor body 203 takes a spiral shape and is provided on the insulating film 202. The inductor body 203 has connecting portions 203A and 203B. The connecting portion 203A is connected to the wiring pattern 206. The connecting portion 203B is connected to the wiring pattern 207.

The insulating film 205 is provided on the insulating film 202 to cover the inductor body 203. The insulating film 205 has an opening portion 211 for exposing an upper surface of the connecting portion 203A and an opening portion 212 for exposing a part of an upper surface of the connecting portion 203B.

The wiring pattern 206 is provided on the opening portion 211 and the insulating film 205. The wiring pattern 206 is electrically connected to the inductor body 203. The wiring pattern 206 is electrically connected to an electronic component (for example, a semiconductor chip) which is not shown.

The wiring pattern 207 is provided on the opening portion 212 and the insulating film 205. The wiring pattern is electrically connected to the inductor body 203. The wiring pattern 207 is electrically connected to an electronic component (for example, a capacitor) which is not shown.

In the inductor device 200 having the structure described above, an outer peripheral side length J of the inductor body 203 is decreased, a width K of the inductor body is reduced and the number of winds of the inductor body 203 is increased to reduce a size of the inductor device 200.

FIGS. 3 to 8 are views showing a process for manufacturing a related-art inductor device. In FIGS. 3 to 8, the same components as those in the related-art inductor device 200 have the same reference numerals.

First of all, at a step shown in FIG. 3, an insulating film 202 (for example, an oxide film) is formed on a semiconductor substrate 201 by a CVD method and a conductive film 215 is then formed on the insulating film 202 by a vapor deposition method or a sputtering method.

At a step shown in FIG. 4, subsequently, a resist film 216 is formed on the conductive film 215 in a corresponding part to a region in which the inductor body 203 is to be formed. At a step shown in FIG. 5, then, the conductive film 215 shown in FIG. 4 is subjected to patterning to form the inductor body 203 by anisotropic etching using the resist film 216 as a mask.

At a step shown in FIG. 6, thereafter, the resist film 216 shown in FIG. 5 is removed. At a step shown in FIG. 7, next, an insulating film 205 having opening portions 211 and 212 is formed on the structure shown in FIG. 6.

At a step shown in FIG. 8, subsequently, wiring patterns and 207 are formed by the same technique as the steps shown in FIGS. 3 to 6. Consequently, an inductor device 200 is manufactured (for example, see Patent Document 1).

[Patent Document 1] Japanese Patent Application Publication No. 2005-79286

In the related-art inductor device 200, however, it has been investigated to decrease the outer peripheral side length J of the inductor body 203, to reduce the width K of the inductor body 203 and to increase the number of winds of the inductor body 203, thereby reducing the size of the inductor device 200. In this case, however, there is a problem in that a resistance loss of the inductor body 203 is increased so that the characteristic of the inductor device 200 is deteriorated.

In order to suppress the increase in the resistance loss of the inductor body 203, therefore, it is proposed to increase a thickness of the conductive film 215 constituting the inductor body 203. In the related-art inductor device 200, however, the inductor body 203 is formed by using the sputtering method or the vapor deposition method. For this reason, it is hard to increase the thickness of the conductive film 215. In the related-art inductor device 200, therefore, there is a problem in that it is impossible to suppress the increase in the resistance loss of the inductor body 203 when the size of the inductor device 200 is reduced.

SUMMARY

Exemplary embodiments of the present invention provide an inductor device and a method of manufacturing the inductor device in which a size can be reduced and an increase in a resistance loss can be suppressed.

An aspect of the invention is directed to an inductor device formed on a semiconductor substrate, comprising an inductor body penetrating the semiconductor substrate, taking a spiral shape and having a conductivity, and an insulating film provided between a side surface of the inductor body and the semiconductor substrate.

According to the invention, by providing the inductor body penetrating the semiconductor substrate, taking the spiral shape and the conductivity, it is possible to reduce a size of the inductor device and to increase a thickness of the inductor body (it is possible to cause the thickness of the inductor body to be almost equal to that of the semiconductor substrate). Therefore, it is possible to suppress an increase in a resistance loss of the inductor device.

Another aspect of the invention is directed to an inductor device formed on a semiconductor substrate comprising a plurality of first conductive members penetrating the semiconductor substrate and disposed concentrically, a plurality of second conductive members penetrating the semiconductor substrate and disposed concentrically, an insulating film provided between side surfaces of the first conductive members and side surfaces of the second conductive members and between the side surfaces of the first and second conductive members and the semiconductor substrate, and a conducive member connecting wiring pattern electrically connecting the first conductive member to the second conductive member which is adjacent to the first conductive member, wherein the first conductive member and the second conductive member are alternately disposed through the insulating film.

According to the invention, the first conductive member and the second conductive member are alternately disposed through the insulating film, and the conductive member connecting wiring pattern electrically connects the first conductive member to the second conductive member which is adjacent to the first conductive member. Consequently, the semiconductor substrate is not present between the first conductive member and the second conductive member. Therefore, it is possible to reduce a size of the inductor device.

Moreover, it is possible to increase the thicknesses of the first and second conductive members (in this case, the thicknesses of the first and second conductive members are set to be equal to the thickness of the semiconductor substrate). Therefore, it is possible to suppress the increase in the resistance loss of the inductor device.

A further aspect of the invention is directed to a method of manufacturing an inductor device comprising an inductor body having a conductivity, comprising a trench portion forming step of forming a trench portion taking a spiral shape to penetrate a semiconductor substrate, an insulating film forming step of forming an insulating film on the semiconductor substrate in a corresponding part to a side surface of the trench portion, and an inductor body forming step of forming the inductor body in the trench portion in which the insulating film is provided.

According to the invention, by forming the trench portion taking the spiral shape to penetrate the semiconductor substrate, then forming the insulating film on the semiconductor substrate in the corresponding part to the side surface of the trench portion and thereafter forming the inductor body in the trench portion in which the insulating film is provided, it is possible to reduce the size of the inductor device and to increase the thickness of the inductor body. Therefore, it is possible to suppress the increase in the resistance loss of the inductor device.

A further aspect of the invention is directed to a method of manufacturing an inductor device formed on a semiconductor substrate, comprising a first penetrating trench forming step of concentrically forming a plurality of first penetrating trenches on the semiconductor substrate, a first insulating film forming step of forming a first insulating film on the semiconductor substrate in corresponding parts to side surfaces of the first penetrating trenches, a first conductive member forming step of forming a first conductive member in the first penetrating trenches respectively after the first insulating film forming step, a second penetrating trench forming step of removing the semiconductor substrate in a part positioned between the first insulating films, thereby forming a plurality of second penetrating trenches between the first insulating films, a second insulating film forming step of forming a second insulating film on the semiconductor substrate in corresponding parts to side surfaces of the second penetrating trenches in which the first insulating film is not formed, a second conductive member forming step of forming a second conductive member in the second penetrating trenches respectively after forming the first and second insulating films, and a conductive member connecting wiring pattern forming step of forming a conductive member connecting wiring pattern for electrically connecting the first conductive member to the second conductive member which is adjacent to the first conductive member.

According to the invention, the first conductive member is formed in the first penetrating trenches in which the first insulating film is provided, the semiconductor substrate in the part positioned between the first insulating films is subsequently removed to form a plurality of second penetrating trenches between the first insulating films, the second insulating film is then formed on the semiconductor substrate in the corresponding parts to the side surfaces of the second penetrating trenches in which the first insulating film is not formed, and the second conductive member is thereafter formed in the second penetrating trenches respectively. Consequently, the semiconductor substrate is not provided between the first conductive member and the second conductive member. Consequently, it is possible to reduce the size of the inductor device.

Moreover, it is possible to increase the thicknesses of the first and second conductive members. Therefore, it is possible to suppress the increase in the resistance loss of the inductor device.

According to the invention, it is possible to reduce a size of an inductor device and to suppress an increase in a resistance loss of the inductor device.

Other features and advantages may be apparent from the following detailed descriptions the accompanying drawings and the claims.

BRIEF DESCRIPTION OF THE DRAWINGS

FIG. 16 is a view (No. 5) showing the step of manufacturing the inductor device according to the first embodiment of the invention, FIG. 17 is a view (No. 6) showing the step of manufacturing the inductor device according to the first embodiment of the invention.

DETAILED DESCRIPTION

Next, embodiments according to the invention will be described with reference to the drawings.

First Embodiment

Figure 1:
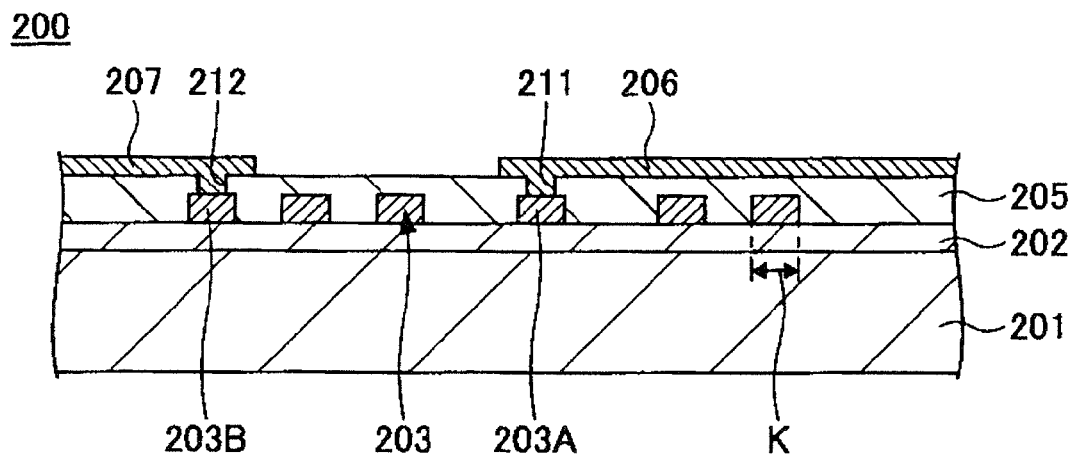
FIG. 1 is a sectional view showing a related-art inductor device.
Figure 2:
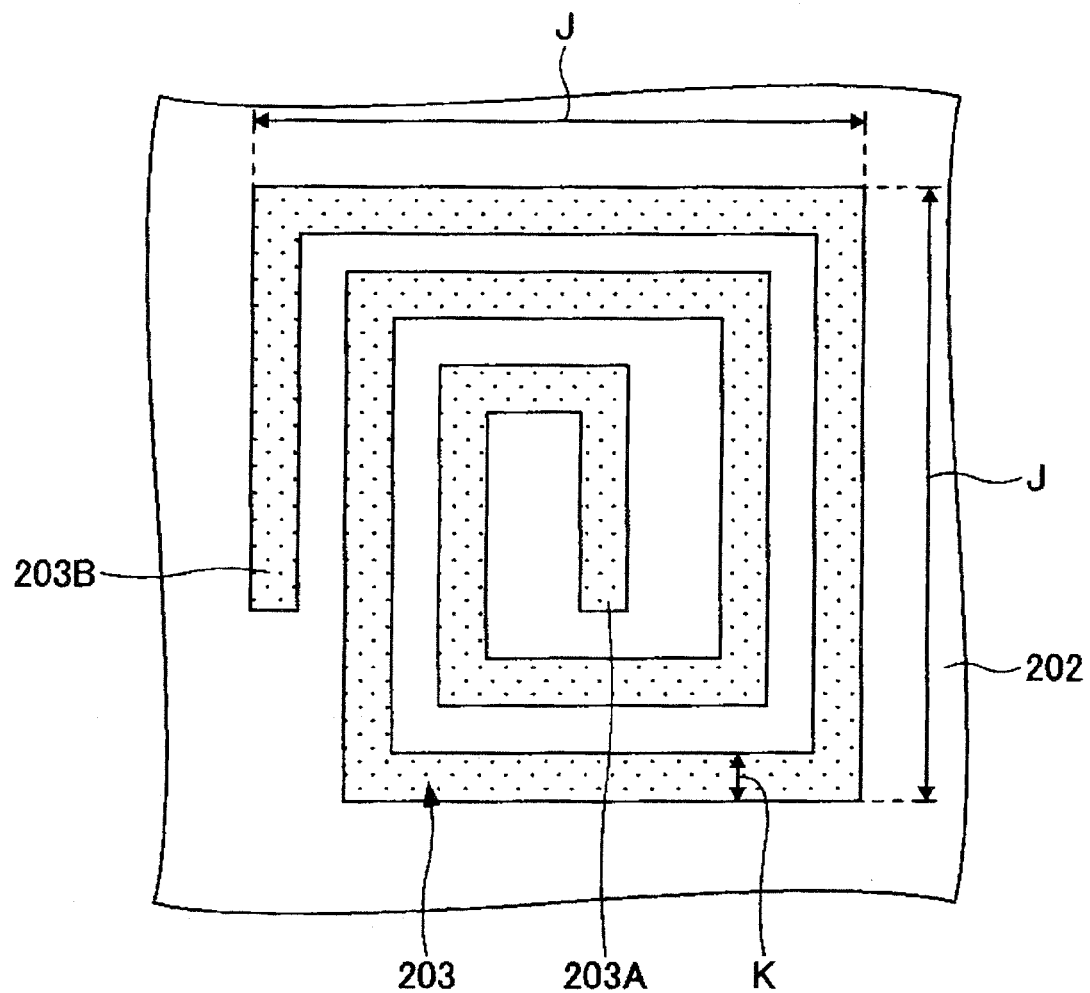
FIG. 2 is a plan view showing an inductor body illustrated in FIG. 1.
Figure 3:
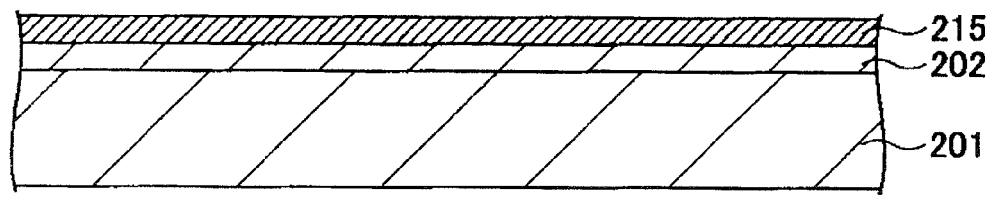
FIG. 3 is a view (No. 1) showing a step of manufacturing the related-art inductor device.
Figure 4:
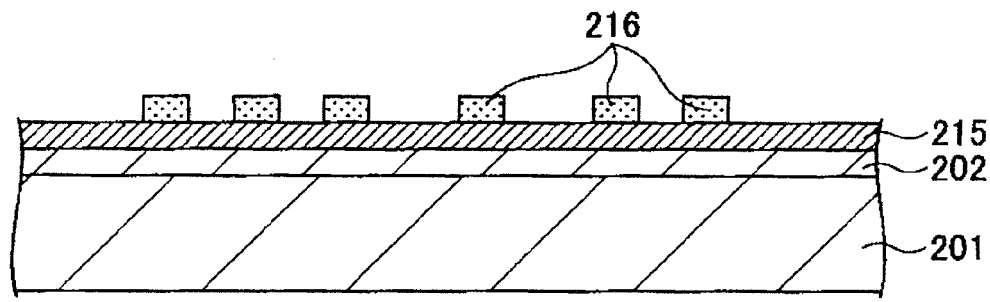
FIG. 4 is a view (No. 2) showing the step of manufacturing the related-art inductor device.
Figure 5:
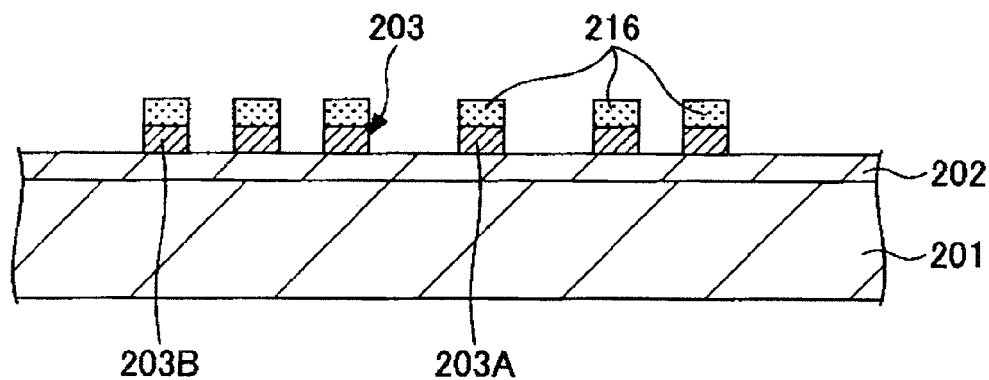
FIG. 5 is a view (No. 3) showing the step of manufacturing the related-art inductor device.
Figure 6:
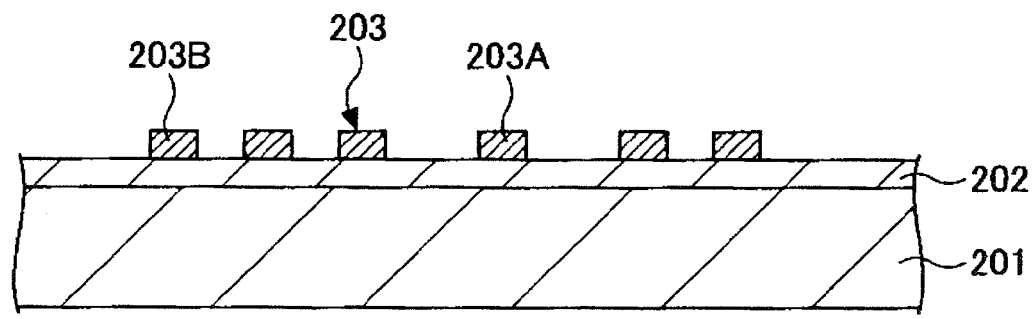
FIG. 6 is a view (No. 4) showing the step of manufacturing the related-art inductor device.
Figure 7:
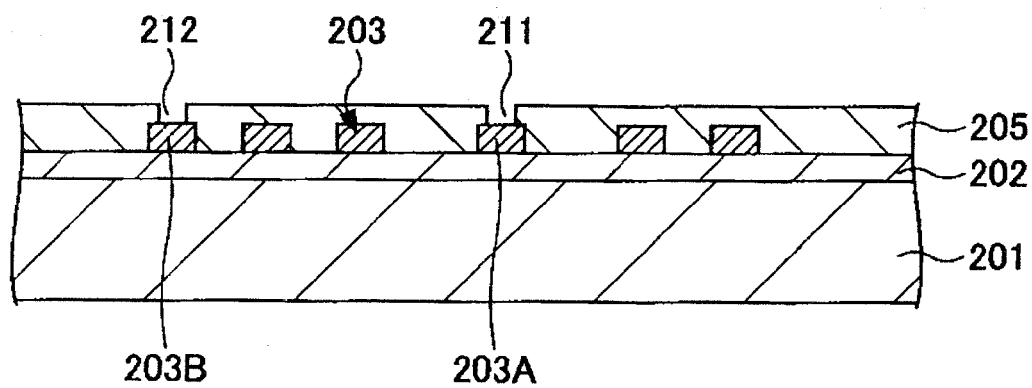
FIG. 7 is a view (No. 5) showing the step of manufacturing the related-art inductor device.
Figure 8:
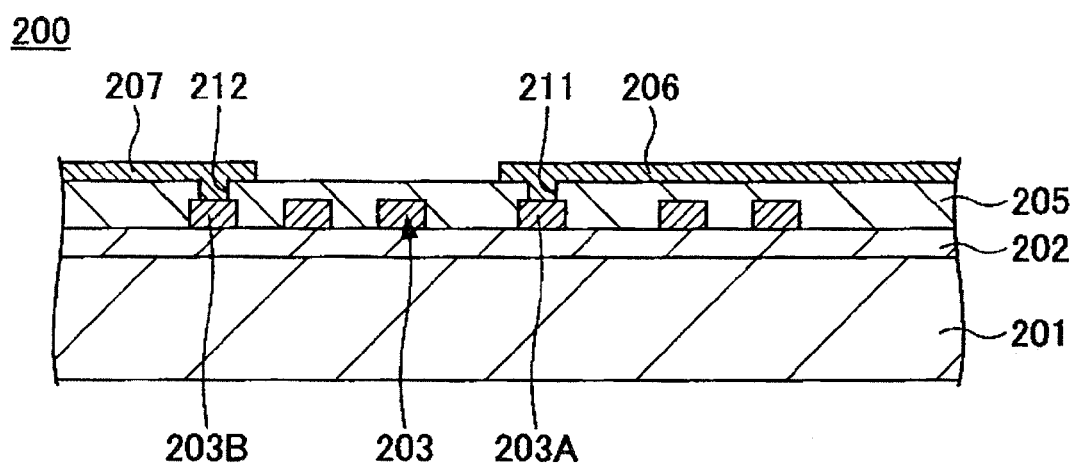
FIG. 8 is a view (No. 6) showing the step of manufacturing the related-art inductor device.
Figure 9:
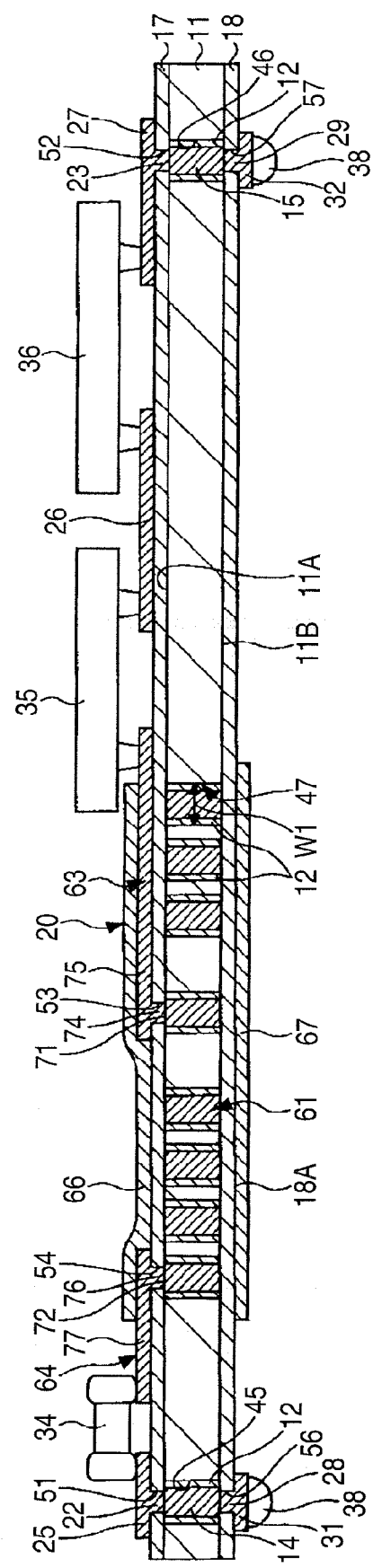
FIG. 9 is a sectional view showing a high frequency module comprising an inductor device according to a first embodiment of the invention.

FIG. 9 is a sectional view showing a high frequency module comprising an inductor device according to a first embodiment of the invention.

Referring to FIG. 9, a high frequency module 10 comprises a semiconductor substrate 11, insulating films 12, 17 and 18, penetrating vias 14 and 15, an inductor device 20, vias 22, 23, 28 and 29, wirings 25 to 27, pads 31 and 32, a chip capacitor 34, a semiconductor chip for a high frequency 35, a semiconductor chip for a CPU 36, and an external connecting terminal 38.

The semiconductor substrate 11 is formed into a thin plate and has penetrating holes 45 and 46 and a trench portion 47 taking a spiral shape. The trench portion 47 is formed to penetrate the semiconductor substrate 11. The trench 47 serves to dispose an inductor body 61 which will be described below. A width W1 of the trench portion 47 can be set to be 60 μm, for example. For the semiconductor substrate 11, it is possible to use a silicon substrate, for example. In the case in which the silicon substrate is used as the semiconductor substrate 11, a thickness of the semiconductor substrate 11 can be set to be 200 μm to 500 μm, for example.

The insulating film 12 is provided between side surfaces of the penetrating vias 14 and 15 and the semiconductor substrate 11 (in other words, the semiconductor substrate 11 in corresponding parts to side surfaces of the penetrating holes 45 and 46) and between a side surface of the inductor body 61 and the semiconductor substrate 11 (in other words, the semiconductor substrate 11 in corresponding parts to a side surface of the trench portion 47). The insulating film 12 serves to insulate the semiconductor substrate 11 from the penetrating vias 14 and 15 and the inductor body 61. For the insulating film 12, it is possible to use an oxide film, for example. In the case in which the oxide film is used as the insulating film 12, a thickness of the insulating film 12 can be set to be 0.5 μm to 2.0 μm, for example.

The penetrating via 14 is provided in the penetrating hole 45 in which the insulating film 12 is formed. An upper end of the penetrating via 14 is connected to the via 22 and a lower end of the penetrating via 14 is connected to the via 28. The penetrating via 14 electrically connects the wiring 25 connected to the via 22 and the pad 31 connected to the via 28. For a material of the penetrating via 14, it is possible to use Cu, for example.

The penetrating via 15 is provided in the penetrating hole 46 in which the insulating film 12 is formed. An upper end of the penetrating via 15 is connected to the via 23 and a lower end of the penetrating via 15 is connected to the via 29. The penetrating via 15 electrically connects the wiring 27 connected to the via 23 and the pad 32 connected to the via 29. For a material of the penetrating via 15, it is possible to use Cu, for example.

The insulating film 17 is provided to cover an upper surface 11A of the semiconductor substrate 11. The insulating film 17 has opening portions 51 to 54. The opening portion 51 is formed to penetrate the insulating film 17 in a part positioned in an upper part the penetrating via 14. The opening portion 52 is formed to penetrate the insulating film 17 in a part positioned in an upper part of the penetrating via 15. Positions in which the opening portions 53 and 54 are formed will be described in an explanation of the structure of the inductor device 20. For the insulating film 17, it is possible to use an oxide film, for example. In the case in which the oxide film is used as the insulating film 17, a thickness of the insulating film 17 can be set to be 0.5 μm to 2.0 μm, for example.

The insulating film 18 is provided to cover a lower surface 11B of the semiconductor substrate 11. The insulating film 18 has opening portions 56 and 57. The opening portion 56 is formed to penetrate the insulating film 18 in a part positioned in a lower part of the penetrating via 14. The opening portion 57 is formed to penetrate the insulating film 18 in a part positioned in a lower part of the penetrating via 15. For the insulating film 18, it is possible to use an oxide film, for example. In the case in which the oxide film is used as the insulating film 18, a thickness of the insulating film 18 can be set to be 0.5 μm to 2.0 μm, for example.

The inductor device 20 has the insulating films 12, 17 and 18, the trench portion 47 taking the spiral shape, the inductor body 61, wiring patterns 63 and 64, and magnetic bodies 66 and 67.

Figure 10:
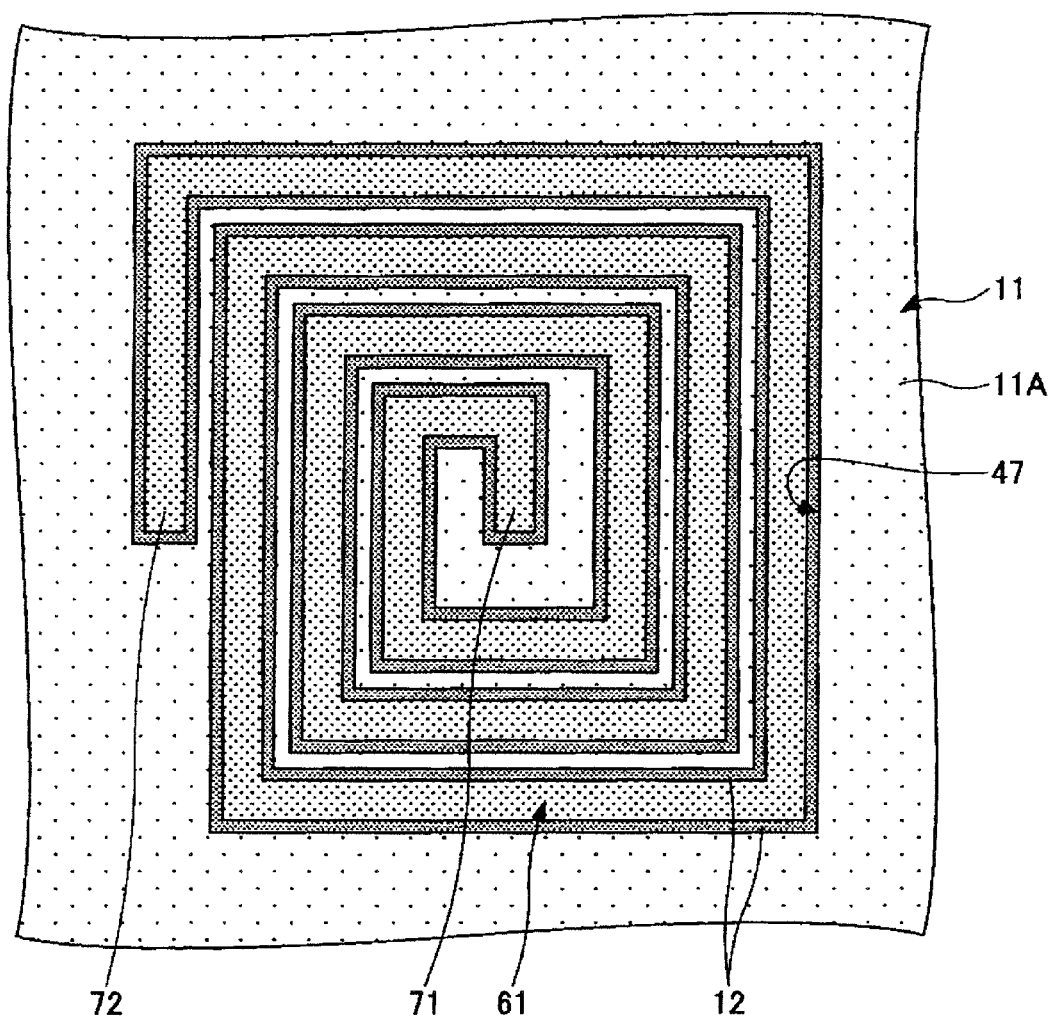
FIG. 10 is a plan view showing an inductor body illustrated in FIG. 9.

FIG. 10 is a plan view showing the inductor body illustrated in FIG. 9.

With reference to FIGS. 9 and 10, the inductor body 61 is provided in the trench portion 47 in which the insulating film 12 (a trench penetrating the semiconductor substrate 11) is formed, and takes a spiral shape. The inductor body 61 has a conductivity and is constituted by a conductive film filling the trench portion 47. An upper surface of the inductor body 61 is on almost the level with the upper surface 11A of the semiconductor substrate 11, and a lower surface of the inductor body 61 is on almost the level with the lower surface 11B of the semiconductor substrate 11. In other words, the inductor body 61 is constituted in such a manner that a thickness of the inductor body 61 (a thickness of the conductive film constituting the inductor body 61) is almost equal to that of the semiconductor substrate 11.

By providing the inductor body 61 which penetrates the semiconductor substrate 11, takes the spiral shape and has the conductivity, thus, it is possible to reduce the size of the inductor device 20, and furthermore, it is possible to increase the thickness of the inductor body 61 (the thickness of the conductive film) (more specifically, it is possible to set the thickness of the inductor body 61 to be almost equal to that of the semiconductor substrate 11). Therefore, it is possible to suppress an increase in a resistance loss of the inductor device 20.

The inductor body 61 has connecting portions 71 and 72. An upper surface of the connecting portion 71 is exposed from the opening portion 53 of the insulating film 17. The opening portion 53 is formed to penetrate the insulating film 17 in a part positioned on the connecting portion 71. The connecting portion 71 is connected to the wiring pattern 63 in a part provided in the opening portion 53.

An upper surface of the connecting portion 72 is exposed from the opening portion 54 of the insulating film 17. The opening portion 54 is formed to penetrate the insulating film 17 in a part positioned on the connecting portion 72. The connecting portion 72 is connected to the wiring pattern 64 in a part provided in the opening portion 54. The insulating film 17 having the opening portions 53 and 54 is disposed to cover the inductor body 61 in a part excluding upper surfaces of the connecting portions 71 and 72 and the upper surface 11A of the semiconductor substrate 11 in a corresponding part to a region in which the inductor body 61 is formed.

The wiring pattern 63 has a via 74 and a wiring 75 constituted integrally with the via 74. The via 74 is provided in the opening portion 53. The via 74 is connected to the connecting portion 71. The wiring 75 is provided on the via 74 and the insulating film 17. The semiconductor chip for a high frequency 35 is mounted on the wiring 75. The wiring pattern 63 electrically connects the semiconductor chip for a high frequency 35 to the inductor body 61. For a material of the wiring pattern 63, it is possible to use Cu, for example.

The wiring pattern 64 has a via 76 and a wiring 77 constituted integrally with the via 76. The via 76 is provided in the opening portion 54. The via 76 is connected to the connecting portion 72. The wiring 77 is provided on the via 76 and the insulating film 17. The chip capacitor 34 is mounted on the wiring 77. The wiring pattern 64 electrically connects the chip capacitor 34 to the inductor body 61. For a material of the wiring pattern 64, it is possible to use Cu, for example.

The magnetic body 66 is provided on the insulating film 17 and the wirings 75 and 77 in parts disposed above the inductor body 61. For a material of the magnetic body 66, it is possible to use ferrite, for example. In the case in which the ferrite is used for the material of the magnetic body 66, a thickness of the magnetic body 66 can be set to be 0.5 μm to 20 μm, for example.

The magnetic body 67 is provided on a surface 18A of the insulating film 18 in a part disposed below the inductor body 61. For a material of the magnetic body 67, it is possible to use the ferrite, for example. In the case in which the ferrite is used for the material of the magnetic body 67, a thickness of the magnetic body 67 can be set to be 0.5 μm to 20 μm, for example.

By providing the magnetic bodies 66 and 67 in a vertical direction of the inductor body 61, thus, it is possible to increase a value of an inductance of the inductor body 61. Therefore, it is possible to enhance a characteristic of the inductor device 20.

With reference to FIG. 9, the via 22 is provided in the opening portion 51. An upper end of the via 22 is connected to the wiring 25 and a lower end of the via 22 is connected to an upper end of the penetrating via 14. The via 22 is constituted integrally with the wiring 25.

The via 23 is provided in the opening portion 52. An upper end of the via 23 is connected to the wiring 27 and a lower end of the via 23 is connected to an upper end of the penetrating via 15. The via 23 is constituted integrally with the wiring 27.

The wiring 25 is provided on the insulating film 17 and the via 22. The wiring 25 is electrically connected to the penetrating via 14 via the via 22. The chip capacitor 34 is mounted on the wiring 25. The wiring 25 is electrically connected to the inductor body 61 through the chip capacitor 34 and the wiring pattern 64.

The wiring 26 is provided on the insulating film 17. The semiconductor chip for a high frequency 35 and the semiconductor chip for a CPU 36 are mounted on the wiring 26. The wiring 26 is electrically connected to the wiring pattern 63 through the semiconductor chip for a high frequency 35. Moreover, the wiring 26 is electrically connected to the wiring 27 through the semiconductor chip for a CPU 36.

The wiring 27 is provided on the insulating film 17 and the via 23. The wiring 27 is electrically connected to the penetrating via 15 through the via 23. The semiconductor chip for a CPU 36 is mounted on the wiring 27. The wiring 27 is electrically connected to the wiring 26 through the semiconductor chip for a CPU 36.

The via 28 is provided in the opening portion 56. The via 28 is constituted integrally with the pad 31. An upper end of the via 28 is connected to a lower end of the penetrating via 14. The via 28 is electrically connected to the via 22 via the penetrating via 14. The via 29 is provided in the opening portion 57. The via 29 is constituted integrally with the pad 32. An upper end of the via 29 is connected to a lower end of the penetrating via 15. The via 29 is electrically connected to the via 23 through the penetrating via 15.

The pad 31 is provided on a lower end of the via 28 and the surface 18A of the insulating film 18. The pad 31 is electrically connected to the penetrating via 14 through the via 28. The external connecting terminal 38 is provided on a lower surface of the pad 31.

The pad 32 is provided on a lower end of the via 29 and the surface 18A of the insulating film 18. The pad 32 is electrically connected to the penetrating via 15 through the via 29. The external connecting terminal 38 is provided on a lower surface of the pad 32. For materials of the vias 22, 23, 28 and 29, the wirings 25 to 27 and the pads 31 and 32, it is possible to use Cu, for example.

The chip capacitor 34 is mounted on the wirings 25 and 77. The chip capacitor 34 is an electronic component which serves to regulate an impedance and functions as a bypass capacitor. The semiconductor chip for a high frequency 35 is mounted on the wirings 26 and 75. The semiconductor chip for a high frequency 35 is an electronic component for modulating/demodulating a signal. The semiconductor chip for a CPU 36 is mounted on the wirings 26 and 27. The semiconductor chip for a CPU 36 is an electronic component for controlling and processing a signal.

The external connecting terminal 38 is provided on the lower surfaces of the pads 31 and 32. For the external connecting terminal 38, it is possible to use a solder ball, for example.

According to the inductor device in accordance with the embodiment, by providing the inductor body 61 which penetrates the semiconductor substrate 11, takes the spiral shape and has the conductivity, it is possible to reduce the size of the inductor device 20, and furthermore, it is possible to increase the thickness of the inductor body 61 (the thickness of the conductive film) (more specifically, it is possible to set the thickness of the inductor body 61 to be almost equal to that of the semiconductor substrate 11). Therefore, it is possible to suppress the increase in the resistance loss of the inductor device 20.

By providing the inductor device 20 according to the embodiment in the high frequency module 10, moreover, it is possible to reduce a size in a planar direction of the semiconductor substrate 11. Therefore, it is possible to reduce a size of the high frequency module 10.

While the description has been given by taking, as an example, the case in which the inductor device 20 is applied to the high frequency module 10 in the embodiment, the inductor device 20 according to the embodiment may be provided in a voltage converting module 80 shown in FIG. 11 which will be described below, for example (a DC-DC converter or a regulator is used for the specific voltage converting module 80, for example).

Figure 11:
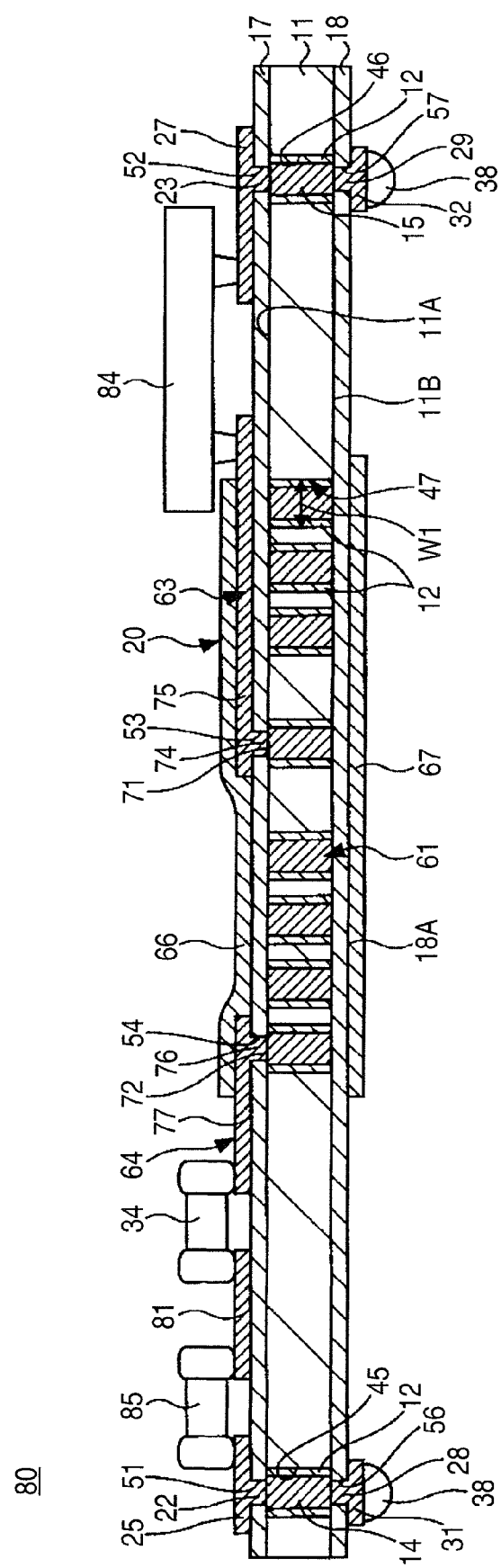
FIG. 11 is a sectional view showing a voltage converting module comprising the inductor device according to the first embodiment of the invention.

FIG. 11 is a sectional view showing a voltage converting module comprising the inductor device according to the first embodiment of the invention. In FIG. 11, the same components as those in the high frequency module 10 (see FIG. 9) described above have the same reference numerals.

With reference to FIG. 11, the voltage converting module 80 has the same structure as that of the high frequency module 10 except that the wiring 26, the semiconductor chip for a high frequency 35 and the semiconductor chip for a CPU 36 which are provided in the high frequency module 10 described above are excluded from the components and a wiring 81, a semiconductor chip 84 and a chip resistor 85 are provided, and a chip capacitor 34 is mounted on the wirings 25 and 81.

The wiring 81 is provided on the insulating film 17 in a part positioned between the wirings 25 and 77. The chip capacitor 34 and the chip resistor 85 are mounted on the wiring 81.

The semiconductor chip 84 is mounted on the wirings 27 and 75. The semiconductor chip 84 is electrically connected to the inductor body 61 through the wiring pattern 63. For the semiconductor chip 84, it is possible to use a semiconductor chip having a switching function, for example.

The chip resistor 85 is mounted on the wirings 25 and 81. The chip resistor 85 is electrically connected to the chip capacitor 34 through the wiring 81. The chip resistor 85 serves to detect a voltage to be applied to the semiconductor chip 84.

By providing the inductor device 20 according to the embodiment in the voltage converting module 80 having the structure described above, it is possible to reduce the size in the planar direction of the semiconductor substrate 11. Therefore, it is possible to reduce a size of the voltage converting module 80.

FIGS. 12 to 21 are views showing a process for manufacturing the inductor device according to the first embodiment of the invention. In FIGS. 12 to 21, the same components as those in the inductor device 20 according to the first embodiment have the same reference numerals.

Figure 12:
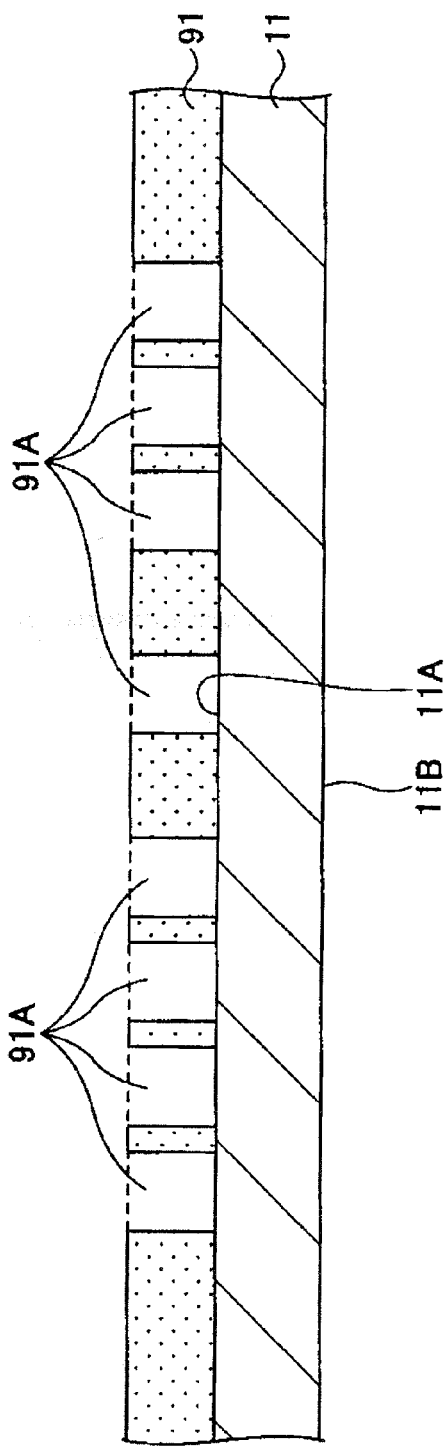
FIG. 12 is a view (No. 1) showing a step of manufacturing the inductor device according to the first embodiment of the invention.

First of all, at a step shown in FIG. 12, a resist film 91 having an opening portion 91A is formed on a semiconductor substrate 11 changed into a thin plate. At this time, the opening portion 91 is formed to expose an upper surface 11A of the semiconductor substrate 11 in a corresponding part to a region in which an inductor body 61 is provided. The opening portion 91A takes a spiral shape as seen on a plane. For the semiconductor substrate 11, it is possible to use a silicon substrate, for example. In the case in which the silicon substrate is used as the semiconductor substrate 11, a thickness of the semiconductor substrate 11 can be set to be 200 µm to 500 µm, for example.

Figure 13:
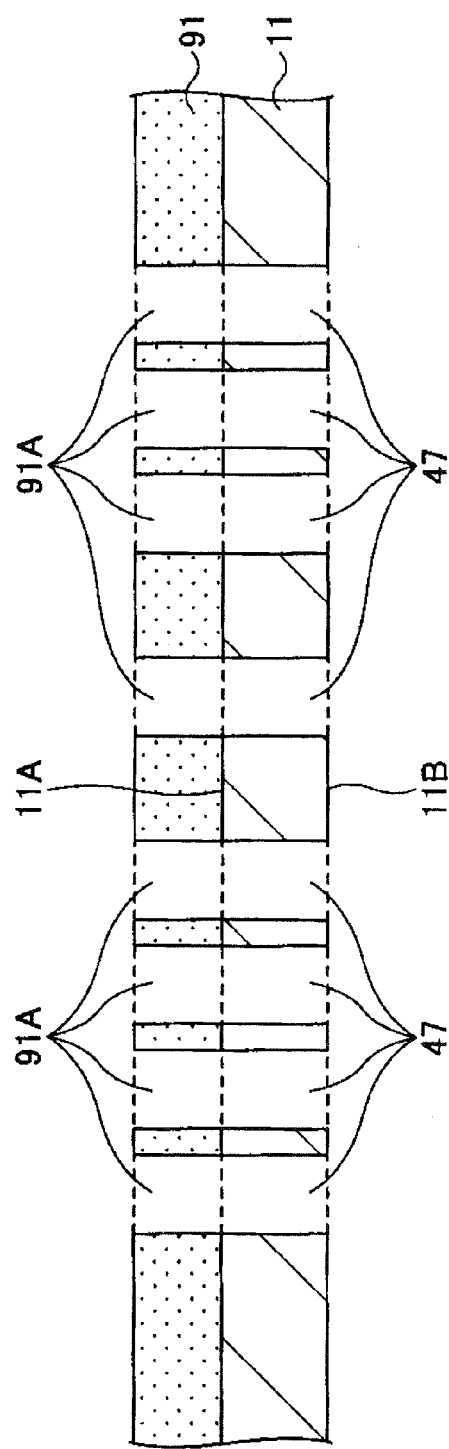
FIG. 13 is a view (No. 2) showing the step of manufacturing the inductor device according to the first embodiment of the invention.
Figure 14:
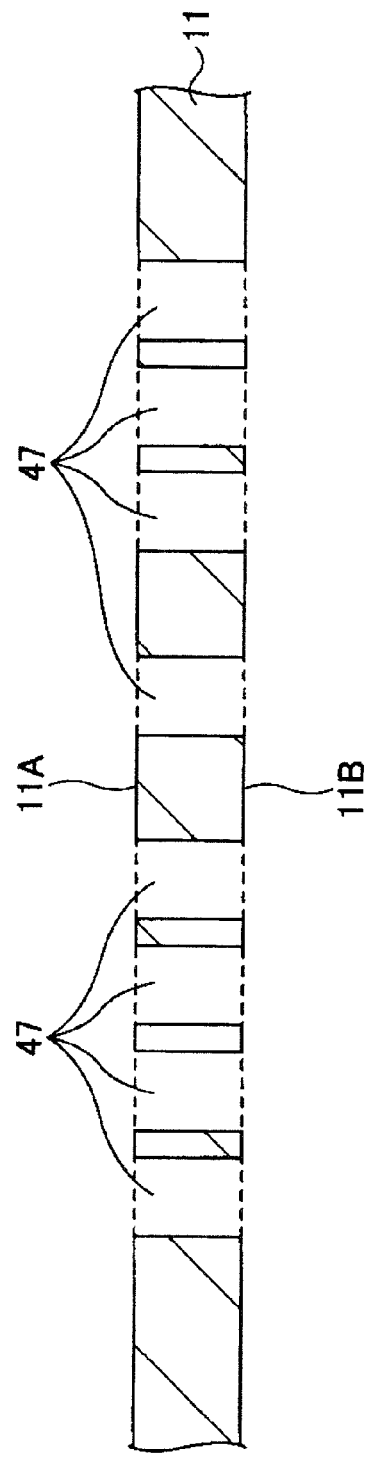
FIG. 14 is a view (No. 3) showing the step of manufacturing the inductor device according to the first embodiment of the invention.

At a step shown in FIG. 13, subsequently, anisotropic etching (for example, dry etching) using the resist film 91 as a mask is carried out to penetrate the semiconductor substrate 11, thereby forming a trench portion 47 taking a spiral shape (a trench portion forming step). A width W1 of the trench portion 47 can be set to be 60 µm, for example. At a step shown in FIG. 14, then, the resist film 91 shown in FIG. 13 is removed.

Figure 15:
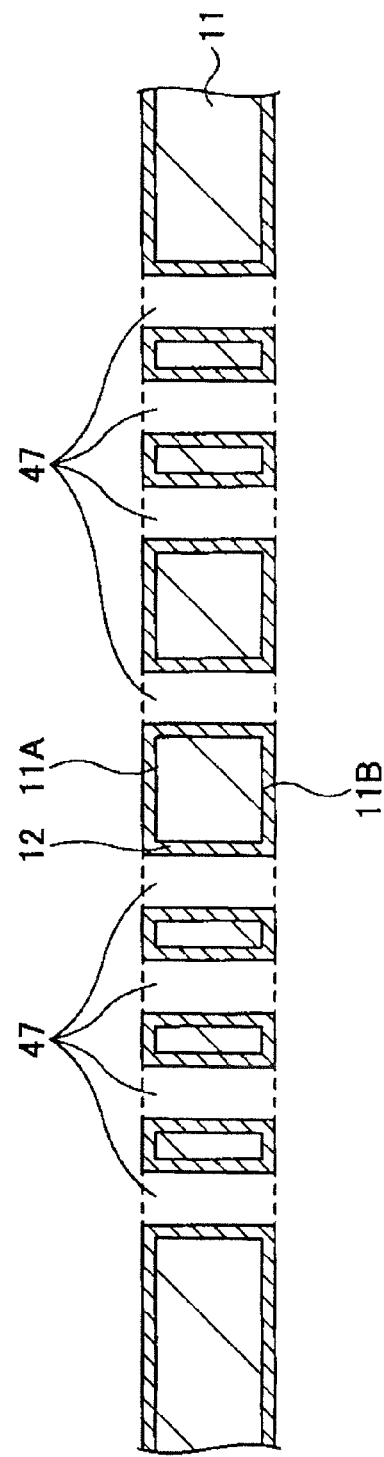
FIG. 15 is a view (No. 4) showing the step of manufacturing the inductor device according to the first embodiment of the invention.

At a step shown in FIG. 15, then, an insulating film 12 is formed to cover at least surfaces of the semiconductor substrate 11 in corresponding parts to side surfaces of the trench portion 47 (an insulating film forming step). For the insulating film 12, it is possible to use an oxide film (for example, a thickness of 0.5 µm to 2.0 µm), for instance. In the embodiment, the following description will be given by taking, as an example, the case in which the insulating film 12 is formed on both surfaces 11A and 11B of the semiconductor substrate 11.

At a step shown in FIG. 16, thereafter, a feeding layer is formed on a lower surface of the structure shown in FIG. 15 (a feeding layer forming step). For the feeding layer 93, it is possible to use a metal foil (for example, a Cu foil) or a metal plate (for example, a Cu plate), for instance. More specifically, a metal foil (for example, a Cu foil) or a metal plate (for example, a Cu plate) are bonded to the lower surface of the structure shown in FIG. 15 to form the feeding layer 93, for example.

At a step shown in FIG. 17, subsequently, a power is fed to the feeding layer 93 to form a conductive film 95 so as to fill the trench portion 47 by an electrolytic plating method (a conductive film forming step). The conductive film 95 serves as a base material of the inductor body 61. For the conductive film 95, it is possible to use a Cu plated film, for example.

Figure 18:
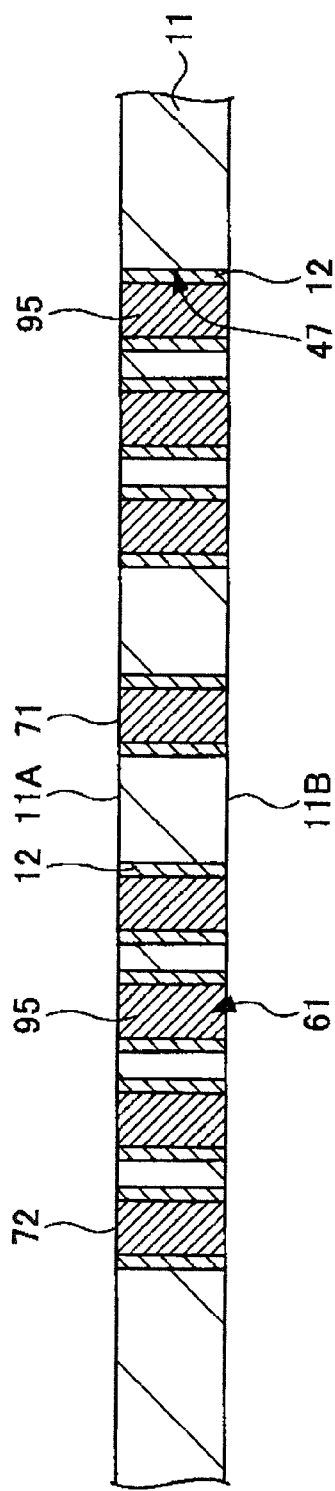
FIG. 18 is a view (No. 7) showing the step of manufacturing the inductor device according to the first embodiment of the invention.

At a step shown in FIG. 18, next, the excessive insulating film 12 and conductive film 95 protruded from the upper surface 11A and the lower surface 11B in the semiconductor substrate 11 and the feeding layer 93 are removed. More specifically, the insulating film 12 and the conductive film 95 are polished until the upper surface 11A of the semiconductor substrate 11 is exposed, and furthermore, the insulating film 12, the feeding layer 93 and the conductive film 95 are polished until the lower surface 11B of the semiconductor substrate 11 is exposed. Consequently, the excessive insulating film 12 and conductive film 95 and the feeding layer 93 are removed (a conductive film removing step and a feeding layer removing step). Consequently, an inductor body 61 penetrating the semiconductor substrate 11 is formed (the steps shown in FIGS. 16 to 18 correspond to an inductor body forming step). A width of the inductor body 61 can be set to be 60 μm, for example.

By forming the insulating film 12 and providing the inductor body 61 in the trench portion 47 taking the spiral shape, thus, it is possible to reduce a size of the inductor device 20 and to increase a thickness of the inductor body 61 (a thickness of the conductive film 95 constituting the inductor body 61). Therefore, it is possible to suppress an increase in a resistance loss of the inductor device 20.

Figure 19:
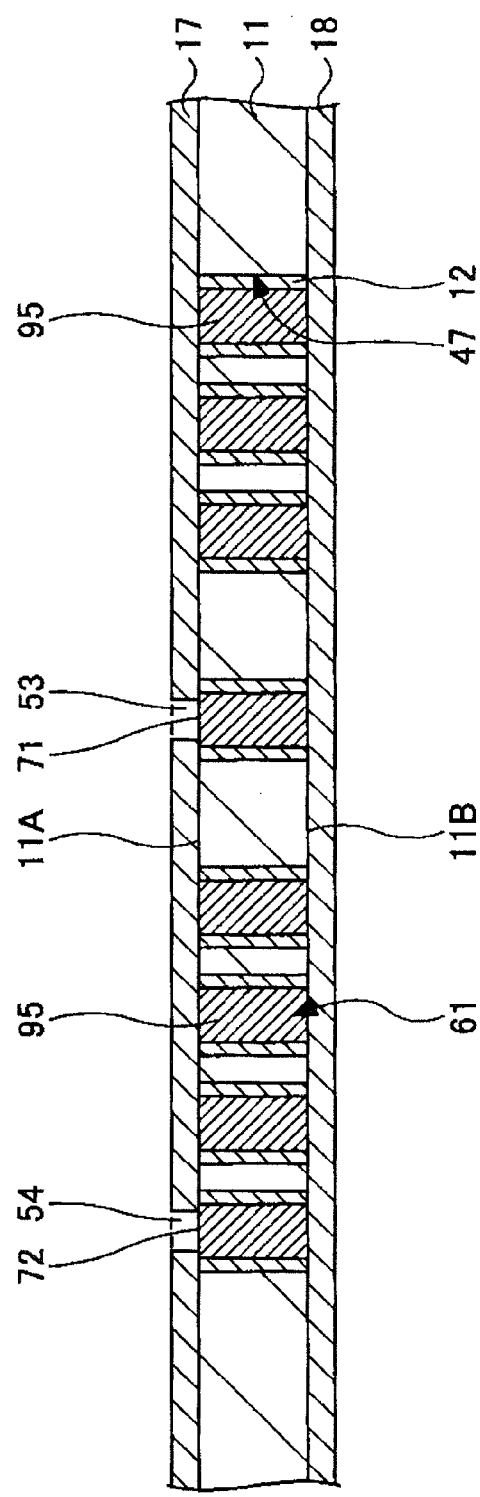
FIG. 19 is a view (No. 8) showing the step of manufacturing the inductor device according to the first embodiment of the invention.

At a step shown in FIG. 19, then, an insulating film 17 having opening portions 53 and 54 is formed on an upper surface of the structure shown in FIG. 18 and an insulating film 18 is formed on a lower surface of the structure shown in FIG. 18. At this time, the opening portion 53 is formed to expose an upper surface of a connecting portion 71 provided on the inductor body 61. The opening portion 54 is formed to expose an upper surface of a connecting portion 72 provided on the inductor body 61. For the insulating films 17 and 18, it is possible to use an oxide film, for example. In the case in which the oxide film is used as the insulating film 17, it is possible to form the insulating film 17 by providing an oxide film through a thermal oxidation method or a CVD method and then carrying out anisotropic etching over a part of the oxide film thus provided, for example. It is possible to form the insulating film 18 through the thermal oxidation method or the CVD method, for example. In the case in which the oxide film is used as the insulating films 17 and 18, it is possible to set thicknesses of the insulating films 17 and 18 to be 0.5 μm to 2.0 μm, for example.

Figure 20:
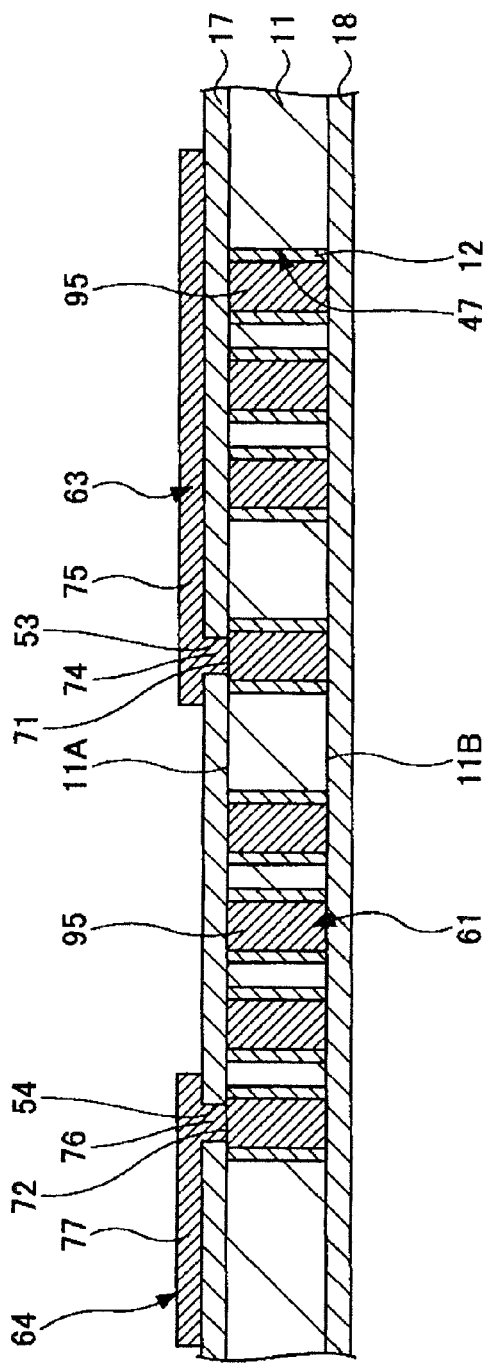
FIG. 20 is a view (No. 9) showing the step of manufacturing the inductor device according to the first embodiment of the invention.

At a step shown in FIG. 20, thereafter, wiring patterns 63 and 64 are formed on the structure shown in FIG. 19. More specifically, the wiring patterns 63 and 64 can be formed by a semiadditive method, for example. For the wiring patterns 63 and 64, it is possible to use a Cu plated film, for example.

At a step shown in FIG. 21, subsequently, a magnetic body 66 is formed to cover the insulating film 17 in a part disposed above the inductor body 61 and wirings 75 and 77, and a magnetic body 67 is formed to cover the insulating film in a part disposed below the inductor body 61. Consequently, the inductor device 20 according to the first embodiment is manufactured.

By forming the magnetic bodies 66 and 67 above and below the inductor body 61, thus, it is possible to increase a value of an inductance of the inductor body 61. Therefore, it is possible to enhance a characteristic of the inductor device 20.

The magnetic bodies 66 and 67 are formed by providing the ferrite film on the upper and lower surfaces of the structure shown in FIG. 20 through a sputtering method and then removing the ferrite film in an unnecessary part through etching, for example. The magnetic bodies 66 and 67 may be formed by a printing method.

According to the method of manufacturing the inductor device in accordance with the embodiment, by forming the trench portion 47 taking the spiral shape to penetrate the semiconductor substrate 11, then forming the insulating film 12 on the semiconductor substrate 11 in the corresponding parts to the side surfaces of the trench portion 47 and thereafter forming the inductor body 61 in the trench portion in which the insulating film 12 is provided, it is possible to reduce the size of the inductor device 20 and to increase the thickness of the inductor body 61 (the thickness of the conductive film 95 constituting the inductor body 61). Therefore, it is possible to suppress the increase in the resistance loss of the inductor device 20.

Second Embodiment

Figure 22:
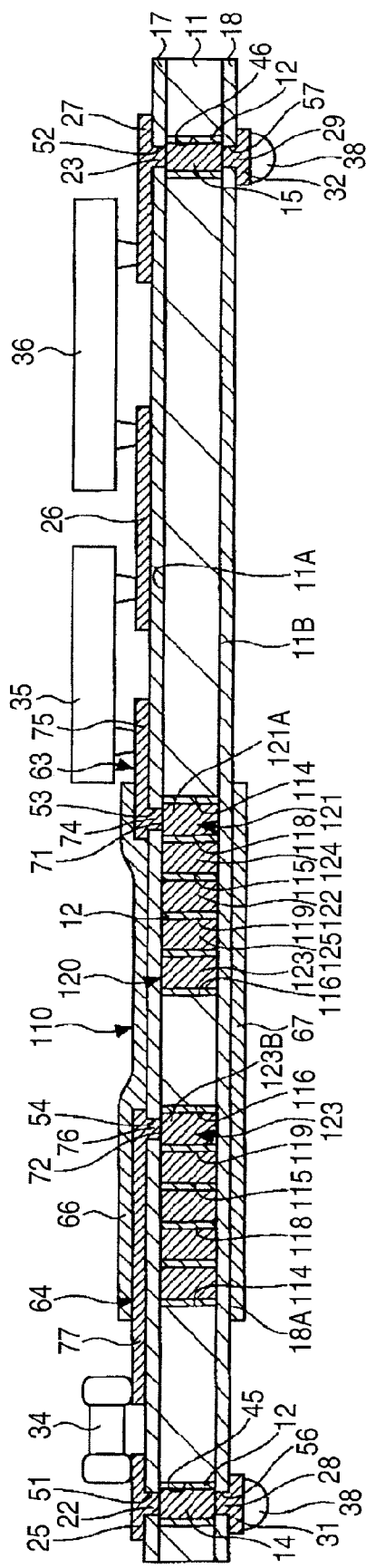
FIG. 22 is a sectional view showing a high frequency module comprising an inductor device according to a second embodiment of the invention.

FIG. 22 is a sectional view showing a high frequency module comprising an inductor device according to a second embodiment of the invention. In FIG. 22, the same components as those in the high frequency module 10 (see FIG. 9) described in the first embodiment have the same reference numerals.

With reference to FIG. 22, the high frequency module 100 has the same structure as the high frequency module 10 except that an inductor device 110 is provided in place of the inductor device 20 provided in the high frequency module 10 described in the first embodiment.

The inductor device 110 has insulating films 12, 17 and 18, first penetrating trenches 114 to 116, second penetrating trenches 118 and 119, an inductor body 120, the insulating films 17 and 18, wiring patterns 63 and 64, and magnetic bodies 66 and 67.

Figure 23:
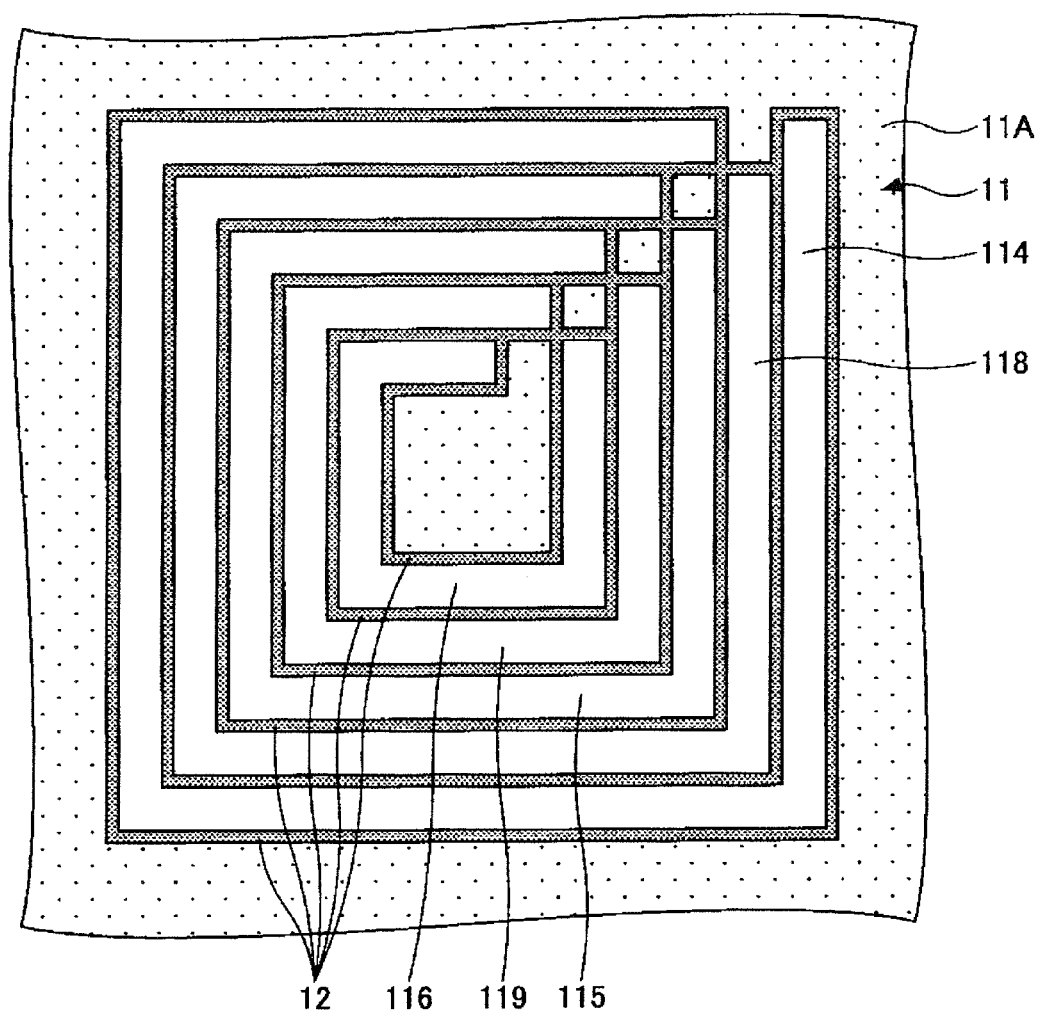
FIG. 23 is a view for explaining forming positions and shapes of first and second penetrating trenches.

FIG. 23 is a view for explaining forming positions and shapes of the first and second penetrating trenches.

With reference to FIGS. 22 and 23, the first penetrating trenches 114 to 116 are formed to penetrate the semiconductor substrate 11 and have different sizes from each other, and are disposed concentrically. The first penetrating trenches 114 to 116 are partially discontinuous and take a shape of a frame seen on a plane.

The first penetrating trench 114 is disposed on an outside of the first penetrating trench 115. The first penetrating trench 114 is provided with a first conductive member 121 which will be described below (one of components of the inductor body 120).

The first penetrating trench 115 is disposed on an inside of the first penetrating trench 114. The first penetrating trench 115 is provided with a first conductive member 122 which will be described below (one of the components of the inductor body 120).

The first penetrating trench 116 is disposed on an inside of the first penetrating trench 115. The first penetrating trench 116 is provided with a first conductive member 123 which will be described below (one of the components of the inductor body 120). An interval between the first penetrating trench 114 and the first penetrating trench 115 is set to be almost equal to that between the first penetrating trench 115 and the first penetrating trench 116. Widths of the first penetrating trenches 114 to 116 can be set to be 60 μm, for example. The insulating film 12 is provided between side surfaces of the first penetrating trenches 114 to 116 and the semiconductor substrate 11.

Second penetrating trenches 118 and 119 are formed to penetrate the semiconductor substrate 11 and have different sizes from each other, and are disposed concentrically. The second penetrating trenches 118 and 119 are partially discontinuous and take a shape of a frame seen on a plane.

The second penetrating trench 118 is disposed between the first penetrating trench 114 and the first penetrating trench 115. The second penetrating trench 118 takes such a shape as to surround the first penetrating trench 115. The insulating film 12 is provided between a side surface of the second penetrating trench 118 and side surfaces of the first penetrating trenches 114, and 115 and between the side surface of the second penetrating trench 118 and the semiconductor substrate 11. The second penetrating trench 118 is constituted by the insulating film 12. The second penetrating trench 118 is provided with a second conductive member 124 which will be described below (one of the components of the inductor body 120).

The second penetrating trench 119 is disposed between the first penetrating trench 115 and the first penetrating trench 116. The second penetrating trench 119 takes such a shape as to surround the first penetrating trench 116. The insulating film 12 is provided between a side surface of the second penetrating trench 119 and side surfaces of the first penetrating trenches 115 and 116 and between the side surface of the second penetrating trench 119 and the semiconductor substrate 11. The second penetrating trench 119 is constituted by the insulating film 12. The second penetrating trench 119 is provided with a second conductive member 125 which will be described below (one of the components of the inductor body 120). Widths of the second penetrating trenches 118 and 119 can be set to be 60 µm, for example.

Figure 24:
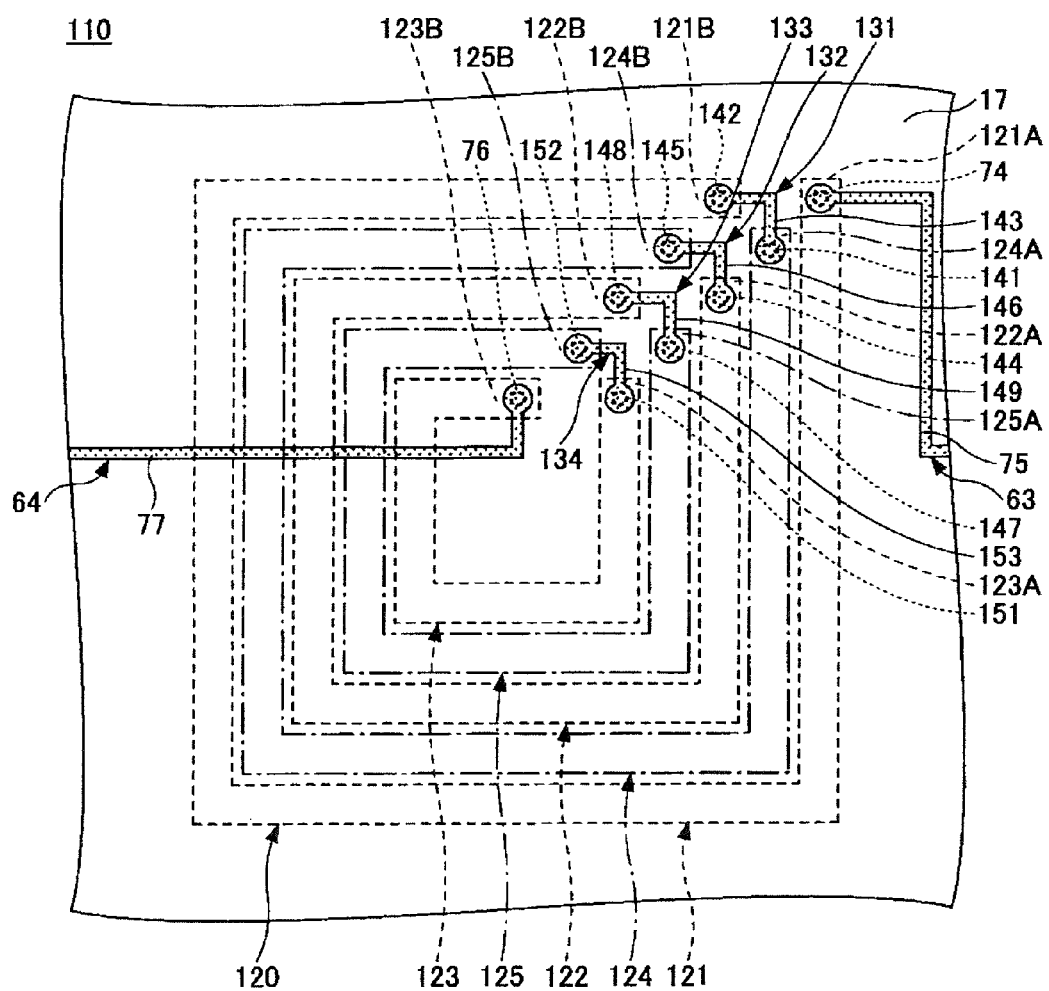
FIG. 24 is a plan view showing the inductor device according to the second embodiment of the invention.

FIG. 24 is a plan view showing the inductor device according to the second embodiment of the invention. In FIG. 24, the same components as those in the structure shown in FIG. 22 have the same reference numerals.

With reference to FIGS. 22 and 24, the inductor body has the first conductive members 121 to 123, the second conductive members 124 and 125, and conductive member connecting wiring patterns 131 to 134.

Figure 25:
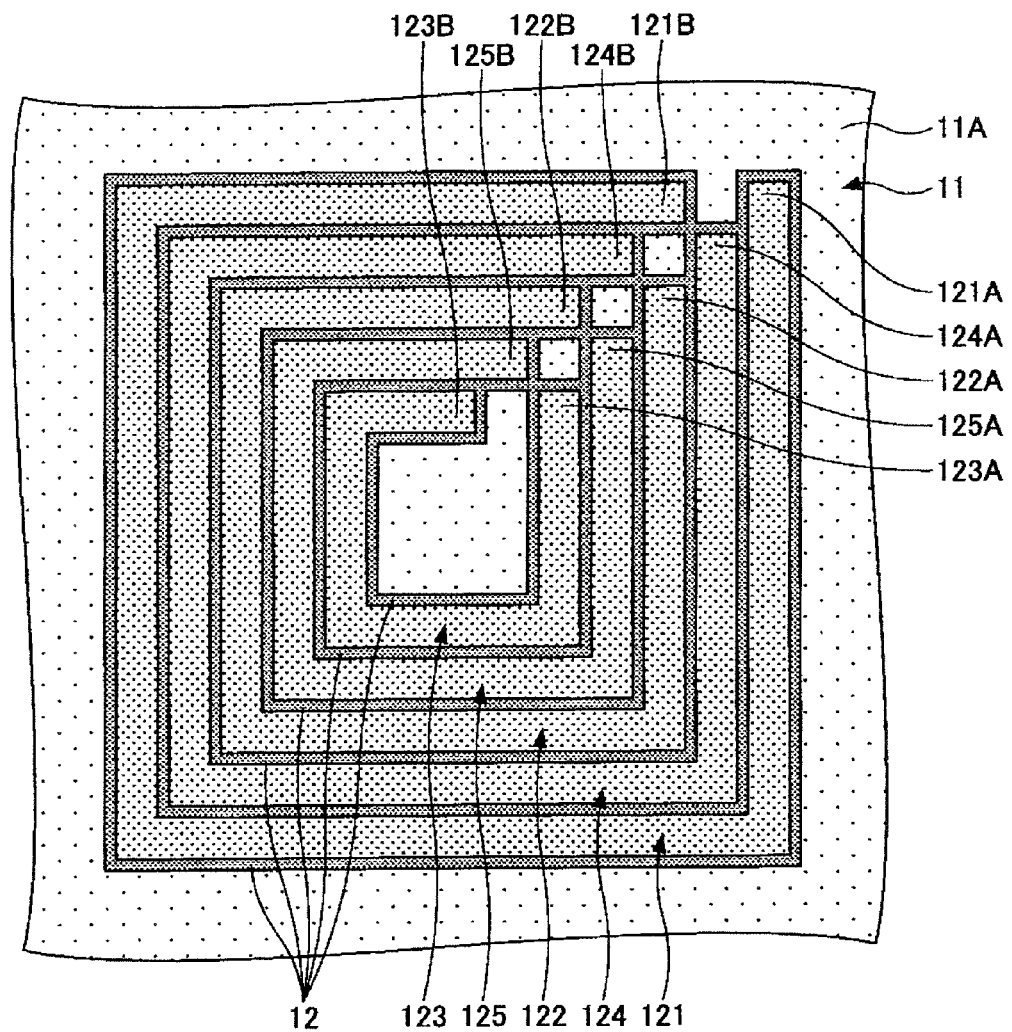
FIG. 25 is a plan view showing an inductor body illustrated in FIG. 22.

FIG. 25 is a plan view showing the inductor body illustrated in FIG. 22. In FIG. 25, the conductive member connecting wiring patterns 131 to 134 are not shown for convenience of the description. In FIG. 25, moreover, the same components as those in the structure shown in FIG. 22 have the same reference numerals.

With reference to FIGS. 22, 24 and 25, next, the first conductive members 121 to 123 and the second conductive members 124 and 125 will be sequentially described.

The first conductive member 121 is disposed in the first penetrating trench 114 in which the insulating film 12 is formed. Consequently, side surfaces of the first conductive member 121 are covered with the insulating film 12. An upper end face of the first conductive member 121 is on almost the level with an upper surface 11A of the semiconductor substrate 11 and a lower end face of the first conductive member 121 is on almost the level with a lower surface 11B of the semiconductor substrate 11.

The first conductive member 121 has a first connecting portion 121A and a second connecting portion 121B. The first connecting portion 121A is connected to a via 74 provided on the wiring pattern 63. The first connecting portion 121A is electrically connected to a semiconductor chip for a high frequency 35 through the wiring pattern 63. The second connecting portion 121B is connected to the conductive member connecting wiring pattern 131. The second connecting portion 121B is electrically connected to the second conductive member 124 through the conductive member connecting wiring pattern 131.

The first conductive member 122 is disposed in the first penetrating trench 115 in which the insulating film 12 is formed. Consequently, side surfaces of the first conductive member 122 are covered with the insulating film 12. An upper end face of the first conductive member 122 is on almost the level with an upper surface 11A of the semiconductor substrate 11 and a lower end face of the first conductive member 122 is on almost the level with a lower surface 11B of the semiconductor substrate 11.

The first conductive member 122 has a first connecting portion 122A and a second connecting portion 122B. The first connecting portion 122A is connected to the conductive member connecting wiring pattern 132. The first connecting portion 122A is electrically connected to the second conductive member 124 through the conductive member connecting wiring pattern 132. The second connecting portion 122B is connected to the conductive member connecting wiring pattern 133. The second connecting portion 122B is electrically connected to the second conductive member 125 through the conductive member connecting wiring pattern 133.

The first conductive member 123 is disposed in the first penetrating trench 116 in which the insulating film 12 is formed. Consequently, side surfaces of the first conductive member 123 are covered with the insulating film 12. An upper end face of the first conductive member 123 is on almost the level with an upper surface 11A of the semiconductor substrate 11 and a lower end face of the first conductive member 123 is on almost the level with a lower surface 11B of the semiconductor substrate 11.

The first conductive member 123 has a first connecting portion 123A and a second connecting portion 123B. The first connecting portion 123A is connected to the conductive member connecting wiring pattern 134. The first connecting portion 123A is electrically connected to the second conductive member 125 through the conductive member connecting wiring pattern 134. The second connecting portion 123B is connected to a via 76 provided on the wiring pattern 64. The second connecting portion 123B is electrically connected to a chip capacitor 34 through the wiring pattern 64.

The second conductive member 124 is disposed in the second penetrating trench 118 surrounded by the insulating film 12. Side surfaces of the second conductive member 124 are covered with the insulating film 12. The second conductive member 124 is adjacent to the first conductive members 121 and 122 through the insulating film 12. An upper end face of the second conductive member 124 is on almost the level with the upper surface 11A of the semiconductor substrate 11 and a lower end face of the second conductive member 124 is on almost the level with the lower surface 11B of the semiconductor substrate 11.

The second conductive member 124 has a first connecting portion 124A and a second connecting portion 124B. The first connecting portion 124A is connected to the conductive member connecting wiring pattern 131. The first connecting portion 124A is electrically connected to the second connecting portion 121B provided in the first conductive member 121 through the conductive member connecting wiring pattern 131. The second connecting portion 124B is connected to the conductive member connecting wiring pattern 132. The second connecting portion 124B is electrically connected to the first connecting portion 122A provided in the first conductive member 122 through the conductive member connecting wiring pattern 132.

The second conductive member 125 is disposed in the second penetrating trench 119 surrounded by the insulating film 12. Side surfaces of the second conductive member 125 are covered with the insulating film 12. The second conductive member 125 is adjacent to the first conductive members 122 and 123 through the insulating film 12. An upper end face of the second conductive member 125 is on almost the level with the upper surface 11A of the semiconductor substrate 11 and a lower end face of the second conductive member 125 is on almost the level with the lower surface 11B of the semiconductor substrate 11.

The second conductive member 125 has a first connecting portion 125A and a second connecting portion 125B. The first connecting portion 125A is connected to the conductive member connecting wiring pattern 133. The first connecting portion 125A is electrically connected to the second connecting portion 122B provided in the first conductive member 122 through the conductive member connecting wiring pattern 133. The second connecting portion 125B is connected to the conductive member connecting wiring pattern 134. The second connecting portion 125B is electrically connected to the first connecting portion 123A provided in the first conductive member 123 through the conductive member connecting wiring pattern 134.

As described above, the first conductive members 121 to 123 and the second conductive members 124 and 125 are alternately disposed through the insulating film 12.

Thus, the first conductive members 121 to 123 and the second conductive members 124 and 125 are alternately disposed in such a manner that the first conductive members 121 and 122 and the second conductive member 124 are adjacent to each other through the insulating film 12 and the first conductive members 122 and 123 and the second conductive member 125 are adjacent to each other through the insulating film 12. Consequently, the semiconductor substrate 11 is not provided between the first and second conductive members 121 to 125 so that a size of the inductor body 120 (more specifically, the size of the inductor body 120 in a direction of the upper surface 11A (or the lower surface 11B) of the semiconductor substrate 11) is reduced. Thus, it is possible to reduce the size of the inductor device 110.

Moreover, it is possible to increase the thicknesses of the first and second conductive members 121 to 125 (in this case, to set the thicknesses of the first and second conductive members 121 to 125 to be equal to the thickness of the semiconductor substrate 11). Therefore, it is possible to suppress an increase in a resistance loss of the inductor device 110.

By providing the inductor device 110 having the inductor body 120 constituted as described above in the high frequency module 100, furthermore, it is possible to reduce the size in a planar direction (the direction of the upper surface 11A or the lower surface 11B) of the semiconductor substrate 11. Therefore, it is possible to reduce the size of the high frequency module 100.

With reference to FIG. 24, the conductive member connecting wiring pattern 131 has vias 141 and 142 and a wiring 143. The via 141 is provided to penetrate the insulating film 17 in a part disposed on the first connecting portion 124A. The via 141 is connected to the first connecting portion 124A. The via 142 is provided to penetrate the insulating film 17 in a part disposed on the second connecting portion 121B. The via 142 is connected to the second connecting portion 121B. The wiring 143 is provided on the vias 141 and 142 and the insulating film 17. The wiring 143 is connected to upper ends of the vias 141 and 142. The wiring 143 is constituted integrally with the vias 141 and 142. The conductive member connecting wiring pattern 131 electrically connects the first conductive member 121 to the second conductive member 124 disposed adjacently to the first conductive member 121.

The conductive member connecting wiring pattern 132 has vias 144 and 145 and a wiring 146. The via 144 is provided to penetrate the insulating film 17 in a part disposed on the first connecting portion 122A. The via 144 is connected to the first connecting portion 122A. The via 145 is provided to penetrate the insulating film 17 in a part disposed on the second connecting portion 124B. The via 145 is connected to the second connecting portion 124B. The wiring 146 is provided on the vias 144 and 145 and the insulating film 17. The wiring 146 is connected to upper ends of the vias 144 and 145. The wiring 146 is constituted integrally with the vias 144 and 145. The conductive member connecting wiring pattern 132 electrically connects the first conductive member 122 to the second conductive member 124 disposed adjacently to the first conductive member 122.

The conductive member connecting wiring pattern 133 has vias 147 and 148 and a wiring 149. The via 147 is provided to penetrate the insulating film 17 in a part disposed on the first connecting portion 125A. The via 147 is connected to the first connecting portion 125A. The via 148 is provided to penetrate the insulating film 17 in a part disposed on the second connecting portion 122B. The via 148 is connected to the second connecting portion 122B. The wiring 149 is provided on the vias 147 and 148 and the insulating film 17. The wiring 149 is connected to upper ends of the vias 147 and 148. The wiring 149 is constituted integrally with the vias 147 and 148. The conductive member connecting wiring pattern 133 electrically connects the first conductive member 122 to the second conductive member 124 disposed adjacently to the first conductive member 122.

The conductive member connecting wiring pattern 134 has vias 151 and 152 and a wiring 153. The via 151 is provided to penetrate the insulating film 17 in a part disposed on the first connecting portion 123A. The via 151 is connected to the first connecting portion 123A. The via 152 is provided to penetrate the insulating film 17 in a part disposed on the second connecting portion 125B. The via 152 is connected to the second connecting portion 125B. The wiring 153 is provided on the vias 151 and 152 and the insulating film 17. The wiring 153 is connected to upper ends of the vias 151 and 152. The wiring 153 is constituted integrally with the vias 151 and 152. The conductive member connecting wiring pattern 134 electrically connects the first conductive member 123 to the second conductive member 125 disposed adjacently to the first conductive member 123.

The inductor body 120 (the structure including the first conductive members 121 to 123, the second conductive members 124 and 125, and the conductive member connecting wiring patterns 131 to 134) takes a spiral shape seen on a plane.

Thus, there are provided the conductive member connecting wiring patterns 131 to 134 for electrically connecting the first conductive members 121 to 123 to the second conductive members 124 and 125 which are adjacent to the first conductive members, and furthermore, the inductor body 120 constituted by the first conductive members 121 to 123, the second conductive members 124 and 125 and the conductive member connecting wiring patterns 131 to 134 is caused to take the spiral shape seen on a plane. Consequently, it is possible to cause a current to spirally flow to the inductor body 110.

With reference to FIGS. 22 and 24, the insulating film 17 is provided to cover the upper surface of the inductor body 120 and the upper surface 11A of the semiconductor substrate 11. The insulating film 17 has a plurality of opening portions which is not shown (the opening portions for disposing the vias 141, 142, 144, 145, 147, 148, 152 and 153) and opening portions 53 and 54. The opening portion 53 is formed to expose the upper surface of the first connecting portion 121A. The opening portion 54 is formed to expose the upper surface of the second connecting portion 123B. The insulating film 18 is provided to cover the lower surface of the inductor body 120 and the lower surface 11B of the semiconductor substrate 11.

The wiring pattern 63 is provided on the insulating film 17 and the opening portion 53. The wiring pattern 63 is connected to the first connecting portion 121A provided on the first conductive member 121. The wiring pattern 63 electrically connects the inductor body 120 to the semiconductor chip for a high frequency 35.

The wiring pattern 64 is provided on the insulating film 17 and the opening portion 54. The wiring pattern 64 is connected to the second connecting portion 123B provided in the first conductive member 123. The wiring pattern 64 electrically connects the inductor body 120 to the chip capacitor 34.

The magnetic body 66 is provided on the insulating film and wirings 75 and 77 in parts disposed above the inductor body 120. The magnetic body 67 is provided on a surface 18A of the insulating film 18 in a part disposed below the inductor body 120. As materials of the magnetic bodies 66 and 67, it is possible to use ferrite, for example. In the case in which the ferrite is used as the materials of the magnetic bodies and 67, thicknesses of the magnetic bodies 66 and 67 can be set to be 0.5 μm to 20 μm, for example.

By providing the magnetic bodies 66 and 67 in a vertical direction of the inductor body 120, thus, it is possible to increase a value of an inductance of the inductor body 120. Therefore, it is possible to enhance a characteristic of the inductor device 110.

According to the inductor device in accordance with the embodiment, the first conductive members 121 to 123 and the second conductive members 124 and 125 are alternately disposed in such a manner that the first conductive members 121 and 122 and the second conductive member 124 are adjacent to each other through the insulating film 12 and the first conductive members 122 and 123 and the second conductive member 125 are adjacent to each other through the insulating film 12. Consequently, the semiconductor substrate 11 is not provided between the first and second conductive members 121 to 125 so that the size of the inductor body 120 is reduced. Thus, it is possible to reduce the size of the inductor device 110.

Moreover, it is possible to increase the thicknesses of the first and second conductive members 121 to 125 (in this case, to set the thicknesses of the first and second conductive members 121 to 125 to be equal to the thickness of the semiconductor substrate 11). Therefore, it is possible to suppress an increase in a resistance loss of the inductor device 110.

By providing the inductor device 110 according to the embodiment in the high frequency module 100, furthermore, it is possible to reduce the size in a planar direction (the direction of the upper surface 11A or the lower surface 11B) of the semiconductor substrate 11. Therefore, it is possible to reduce the size of the high frequency module 100.

While the description has been given by taking, as an example, the case in which the inductor device 110 is applied to the high frequency module 100 in the embodiment, it is also possible to provide the inductor device 110 in place of the inductor device 20 provided in the voltage converting module (see FIG. 11) described in the first embodiment. In this case, as compared with the case in which the inductor device 20 is provided, it is possible to reduce the size of the voltage converting module 80 more greatly.

Figure 26:
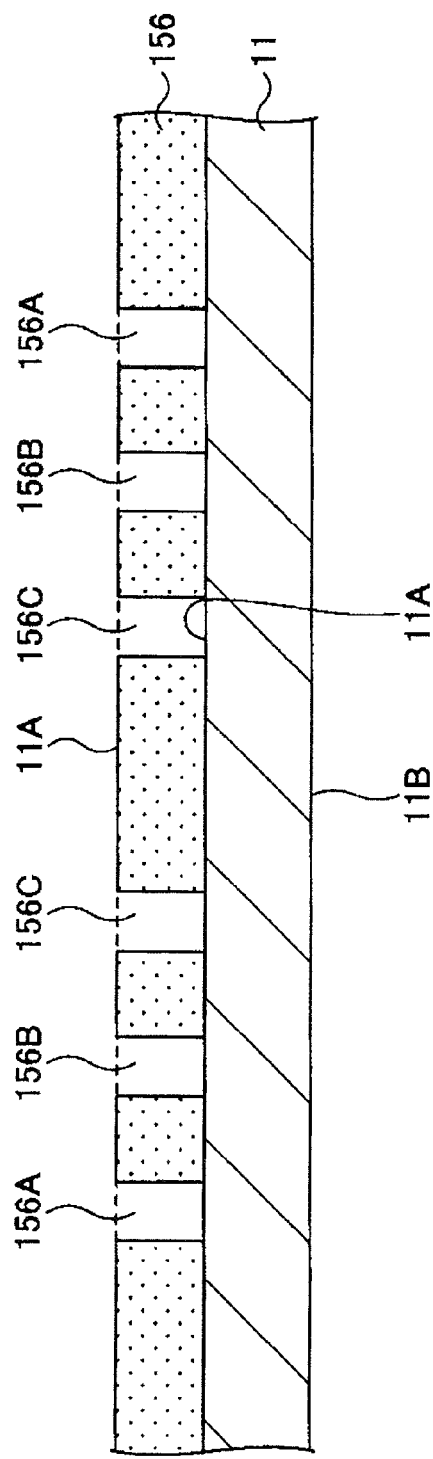
FIG. 26 is a view (No. 1) showing a step of manufacturing the inductor device according to the second embodiment of the invention.
Figure 27:
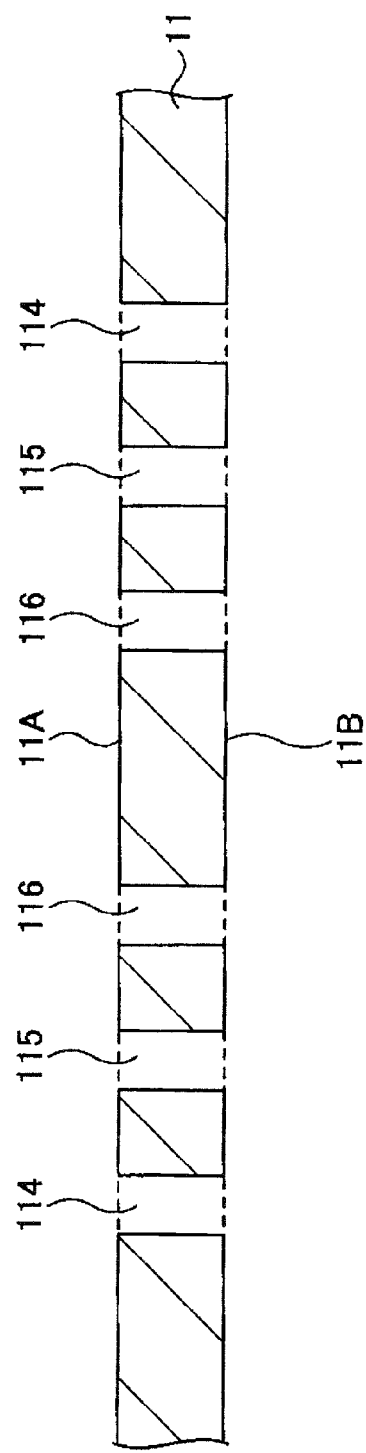
FIG. 27 is a view (No. 2) showing the step of manufacturing the inductor device according to the second embodiment of the invention.
Figure 29:
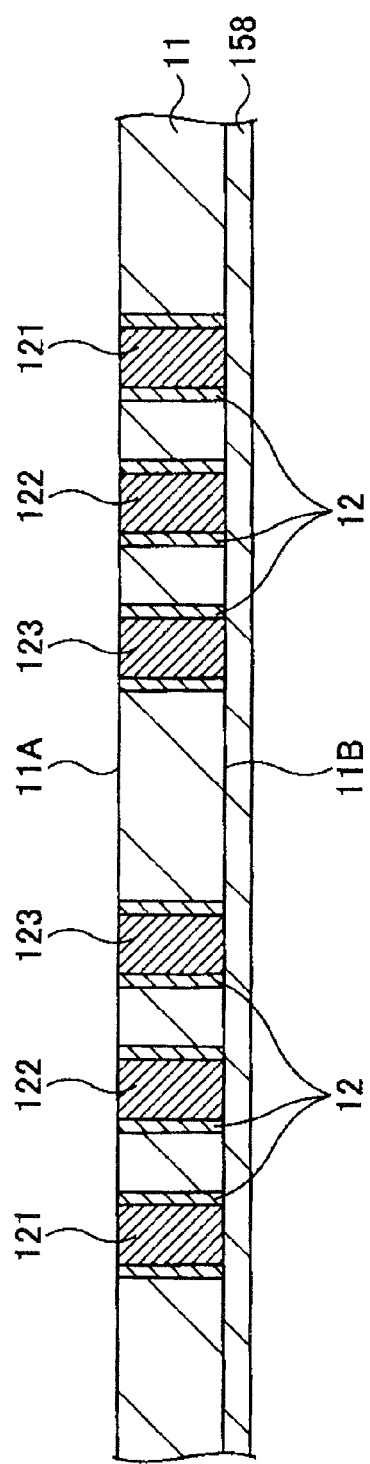
FIG. 29 is a view (No. 4) showing the step of manufacturing the inductor device according to the second embodiment of the invention.
Figure 30:
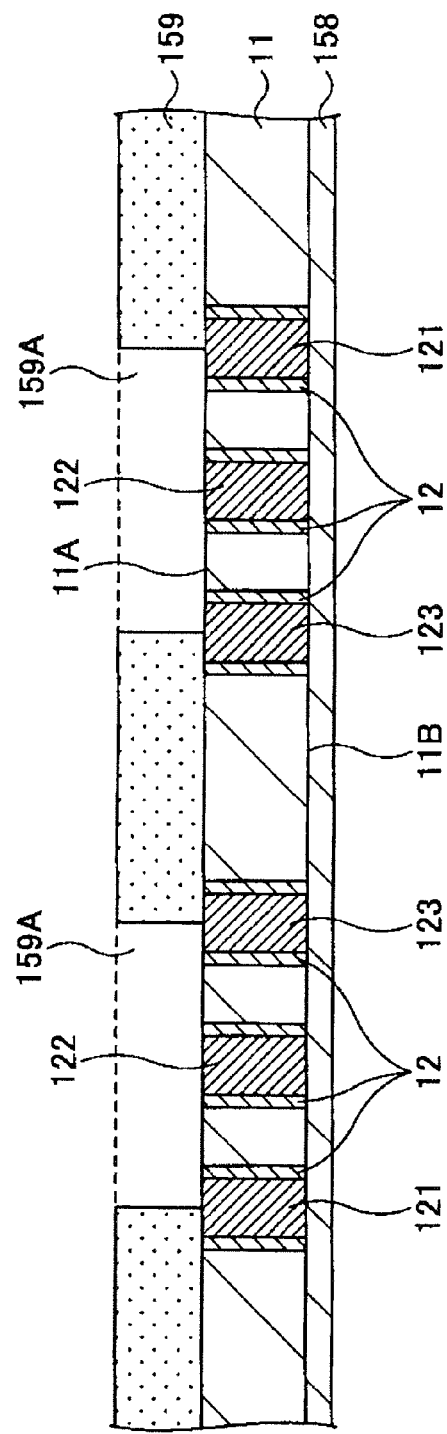
FIG. 30 is a view (No. 5) showing the step of manufacturing the inductor device according to the second embodiment of the invention.
Figure 31:
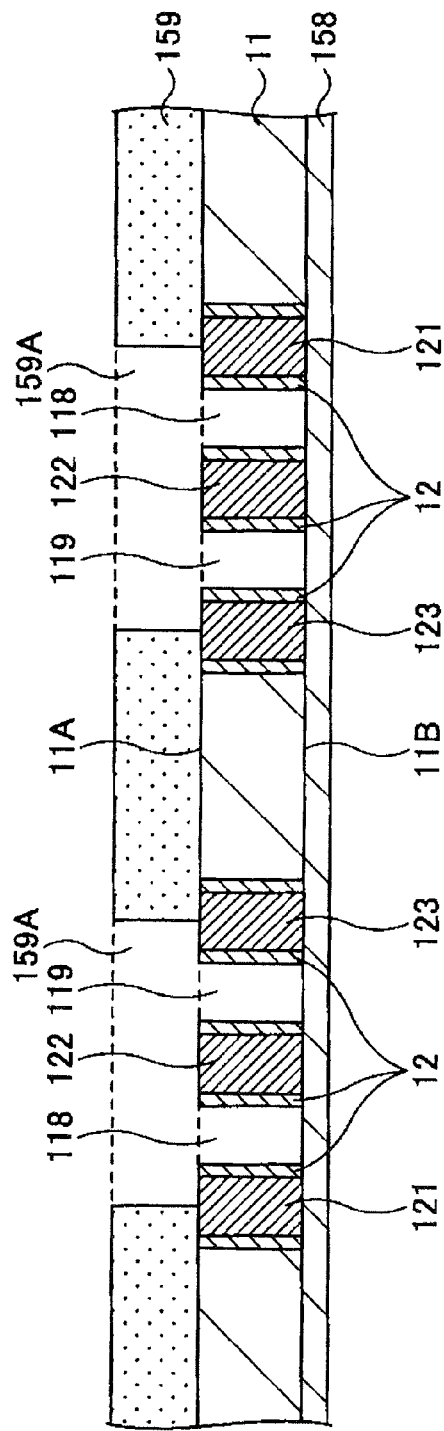
FIG. 31 is a view (No. 6) showing the step of manufacturing the inductor device according to the second embodiment of the invention.
Figure 38:
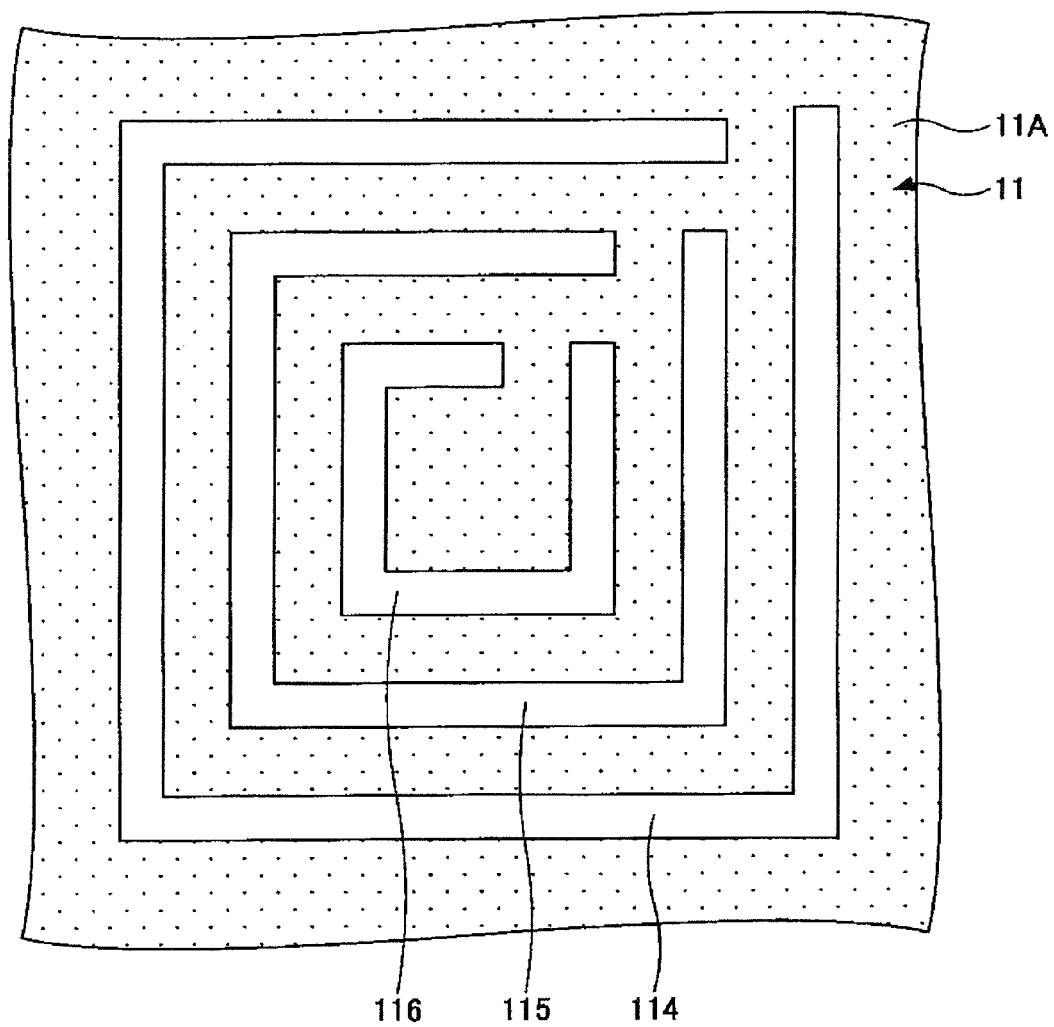
FIG. 38 is a plan view showing a structure illustrated in FIG. 27.
Figure 39:
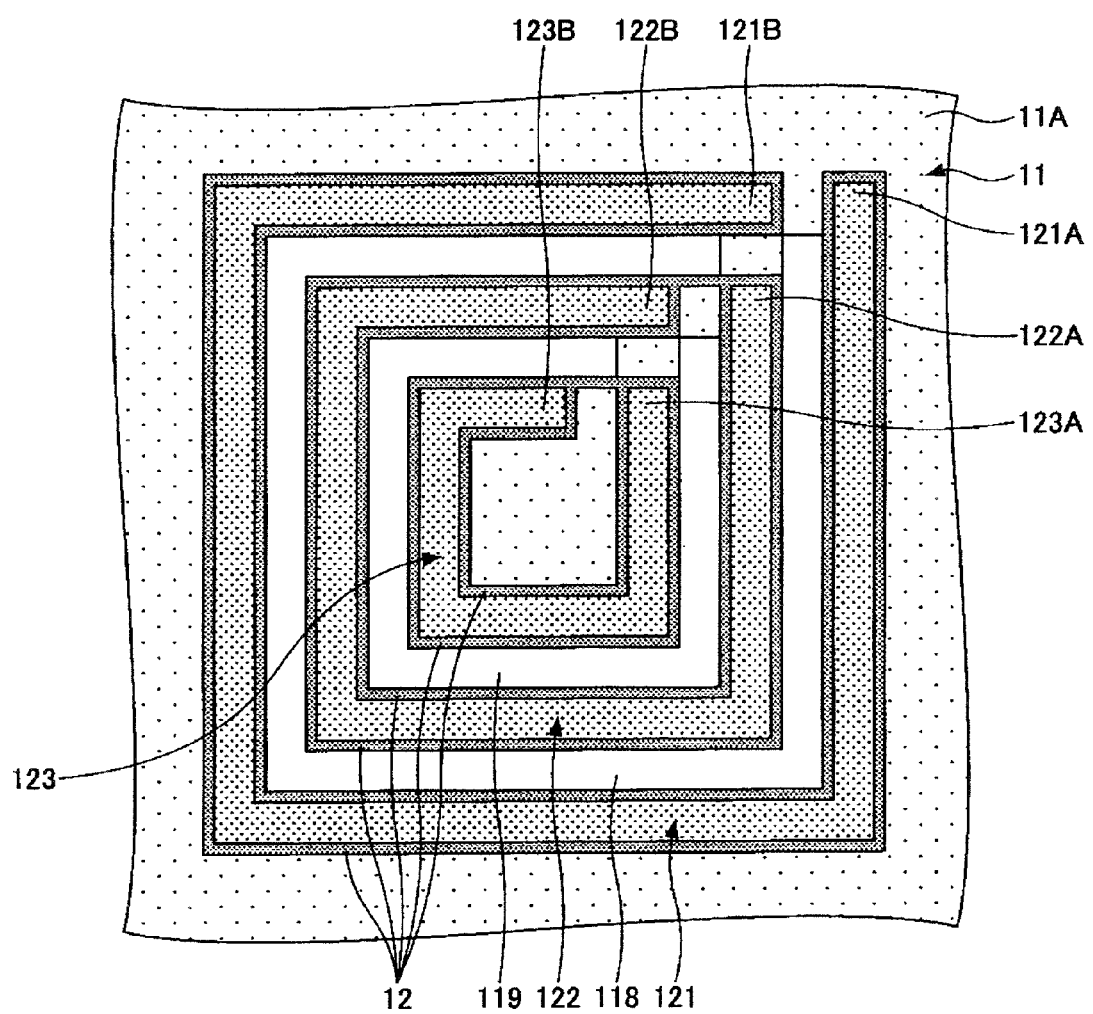
FIG. 39 is a plan view showing a structure illustrated in FIG. 31.
Figure 40:
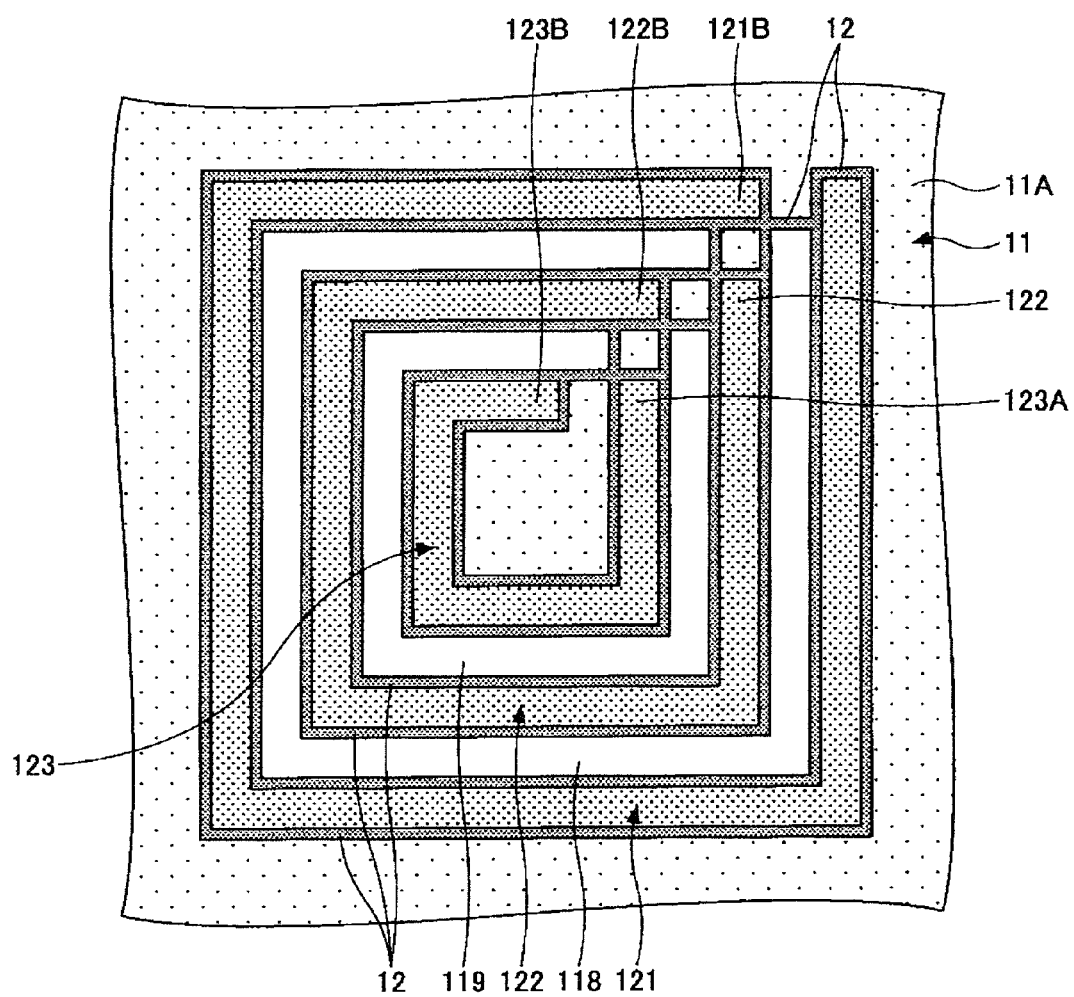
FIG. 40 is a plan view showing a structure illustrated in FIG. 32.

FIGS. 26 to 37 are views showing a process for manufacturing the inductor device according to the second embodiment of the invention. FIG. 38 is a plan view showing a structure illustrated in FIG. 27, FIG. 39 is a plan view showing a structure illustrated in FIG. 31, and FIG. 40 is a plan view showing a structure illustrated in FIG. 32. In FIGS. 26 to 40, the same components as those in the inductor device 110 according to the second embodiment have the same reference numerals. In FIG. 39, moreover, a resist film 159 is not shown for convenience of the description.

First of all, at a step shown in FIG. 26, a resist film 156 having opening portions 156A to 156C disposed concentrically is formed on a semiconductor substrate 11 formed into a thin plate. For the semiconductor substrate 11, it is possible to use a silicon substrate, for example. In the case in which the silicon substrate is used for the semiconductor substrate 11, a thickness of the semiconductor substrate 11 can be set to be 200 μm to 500 μm, for example. The opening portion 156A is formed to expose an upper surface 11A of the semiconductor substrate 11 in a corresponding part to a region in which a first penetrating trench 114 is provided, and the opening portion 156B is formed to expose the upper surface 11A of the semiconductor substrate 11 in a corresponding part to a region in which a first penetrating trench 115 is provided. Moreover, the opening portion 156C is formed to expose the upper surface 11A of the semiconductor substrate 11 in a corresponding part to a region in which a first penetrating trench 116 is provided.

Figure 37:
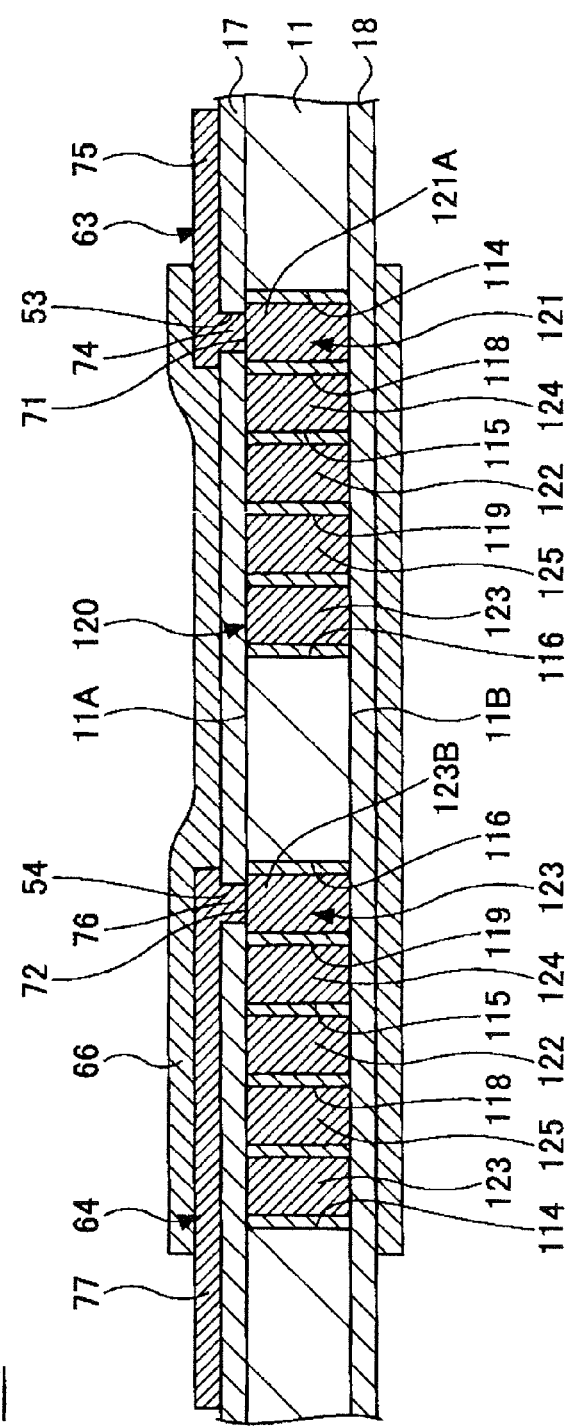
FIG. 37 is a view (No. 12) showing the step of manufacturing the inductor device according to the second embodiment of the invention.

At a step shown in FIG. 27, subsequently, anisotropic etching using the resist film 156 shown in FIG. 26 as a mask (for example, dry etching) is carried out to penetrate the semiconductor substrate 11 in exposed parts to the opening portions 156A to 156C so that first penetrating trenches 114 to 116 are concentrically formed (see a plan view of FIG. 37 showing the semiconductor substrate 11 in which the first penetrating trenches 114 to 116 are formed) (a first penetrating trench forming step). Widths of the first penetrating trenches 114 to 116 can be set to be 60 μm, for example. In this case, providing pitches of the first penetrating trenches 114 to 116 can be set to be 61.5 μm, for example.

Figure 28:
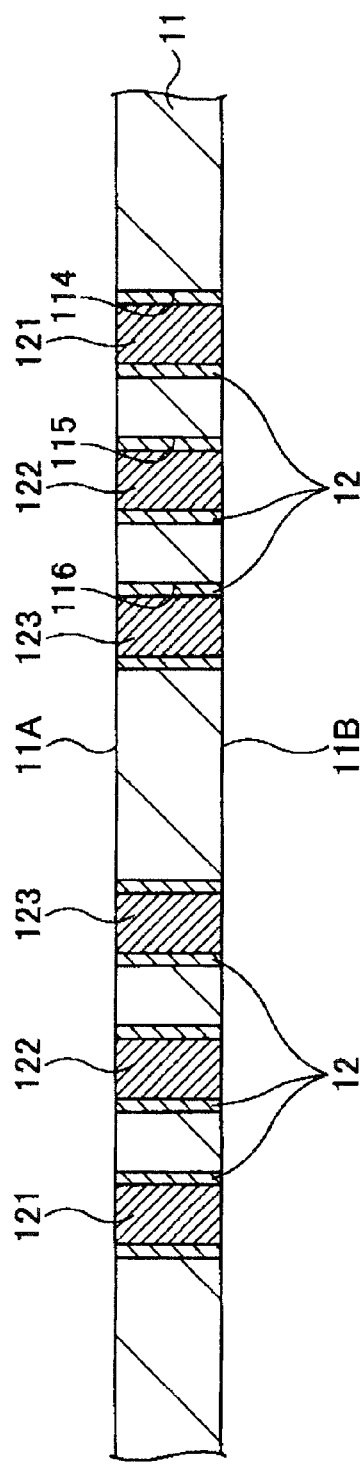
FIG. 28 is a view (No. 3) showing the step of manufacturing the inductor device according to the second embodiment of the invention.

At a step shown in FIG. 28, next, the same processings as those of the steps shown in FIGS. 15 to 18 described in the first embodiment are carried out to form an insulating film 12 for covering a surface of the semiconductor substrate 11 in corresponding parts to side surfaces of the first penetrating trenches 114 to 116 (a first insulating film forming step) and first conductive members 121 to 123 are then formed in the first penetrating trenches 114 to 116 in which the insulating film 12 is provided (a first conductive member forming step).

By forming the first conductive members 121 to 123 in the first penetrating trenches 114 to 116 penetrating the semiconductor substrate 11, thus, it is possible to increase thicknesses of the first conductive members 121 to 123. Consequently, it is possible to suppress an increase in a resistance loss of the inductor device 110.

For the insulating film 12, it is possible to use an oxide film (for example, a thickness of 0.5 μm to 2.0 μm), for instance. In the case in which the oxide film is used for the insulating film 12, the insulating film 12 can be formed by a thermal oxidation method or a CVD method, for example. For materials of the first conductive members 121 to 123, it is possible use Cu, for example. In the case in which the Cu is used for the materials of the first conductive members 121 to 123, for example, a feeding layer 93 is stuck to a lower surface 11B of the semiconductor substrate 11 (a feeding layer forming step), a Cu plated film is then deposited and grown on the feeding layer 93 by an electrolytic plating method to fill the first penetrating trenches 114 to 116 with the Cu plated film (a first plated film forming step), and the Cu plated film and the insulating film 12 in parts protruded from the upper surface 11A and the lower surface 11B in the semiconductor substrate 11 and the feeding layer 93 are then removed (a first plated film removing step and a feeding layer removing step). Consequently, the first conductive members 121 to 123 are formed. Widths of the first conductive members 121 to 123 can be set to be 60 μm, for example.

At a step shown in FIG. 29, subsequently, a fixing adhesive sheet 158 is stuck to a lower surface of the structure shown in FIG. 28. A thickness of the fixing adhesive sheet 158 can be set to be 30 μm, for example.

At a step shown in FIG. 30, then, a resist film 159 having an opening portion 159A is formed on the structure shown in FIG. 29. The opening portion 159A is formed to expose the upper surface 11A of the semiconductor substrate 11 in parts positioned between the first conductive members 121 and 123 and the first conductive member 122.

At a step shown in FIG. 31, thereafter, anisotropic etching using the resist film 159 as a mask is carried out over the semiconductor substrate 11 in an exposed part to the opening portion 159A (the semiconductor substrate 11 in a part disposed between the insulating films 12 (the first insulating films)) to form second penetrating trenches 118 and 119 (see a plan view of FIG. 38 showing the semiconductor substrate 11 on which the second penetrating trenches 118 and 119 are formed) (a second penetrating trench forming step) Widths of the second penetrating trenches 118 and 119 can be set to be 60 μm, for example.

Figure 32:
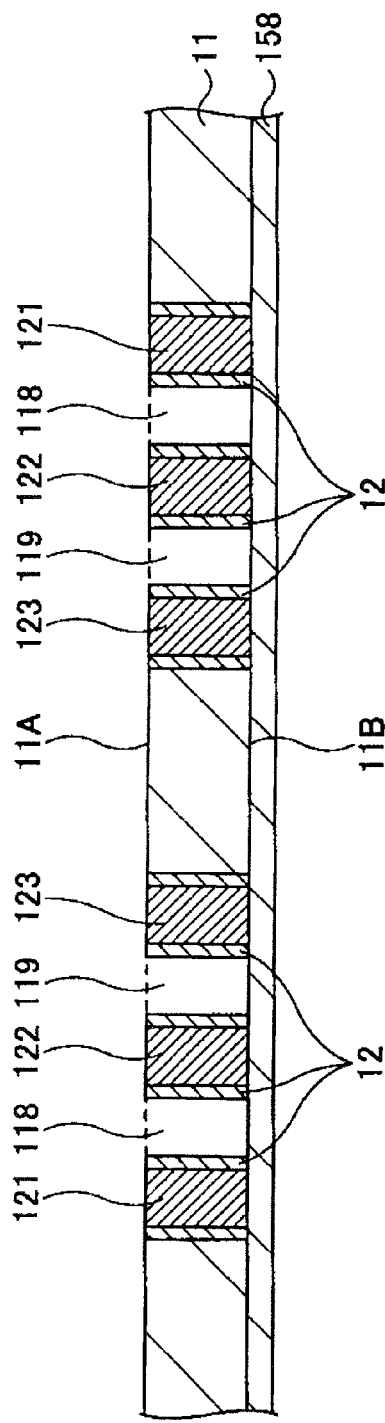
FIG. 32 is a view (No. 7) showing the step of manufacturing the inductor device according to the second embodiment of the invention.

At a step shown in FIG. 32, next, the resist film 159 shown in FIG. 31 is removed and the insulating film 12 (a second insulating film) is formed on a surface of the semiconductor substrate 11 in corresponding parts to side surfaces of the second penetrating trenches 118 and 119 in which the insulating film 12 (the first insulating film) is not formed (see FIG. 39) (a second insulating film forming step). For the insulating film 12 (the second insulating film), it is possible to use an oxide film, for example. In the case in which the oxide film is used as the insulating film 12 (the second insulating film), the insulating film 12 (the second insulating film) can be formed by a thermal oxidation method or a CVD method, for example.

At a step shown in FIG. 33, subsequently, a feeding layer 161 is formed to cover an upper surface of the structure shown in FIG. 32 (a feeding layer forming step). For the feeding layer 161, it is possible to use a metal foil (for example, a Cu foil) or a metal plate (for example, a Cu plate), for instance. More specifically, the feeding layer 161 is formed by sticking the metal foil (for example, the Cu foil) or the metal plate (for example, the Cu plate) to a lower surface of the structure shown in FIG. 32, for example.

Figure 33:
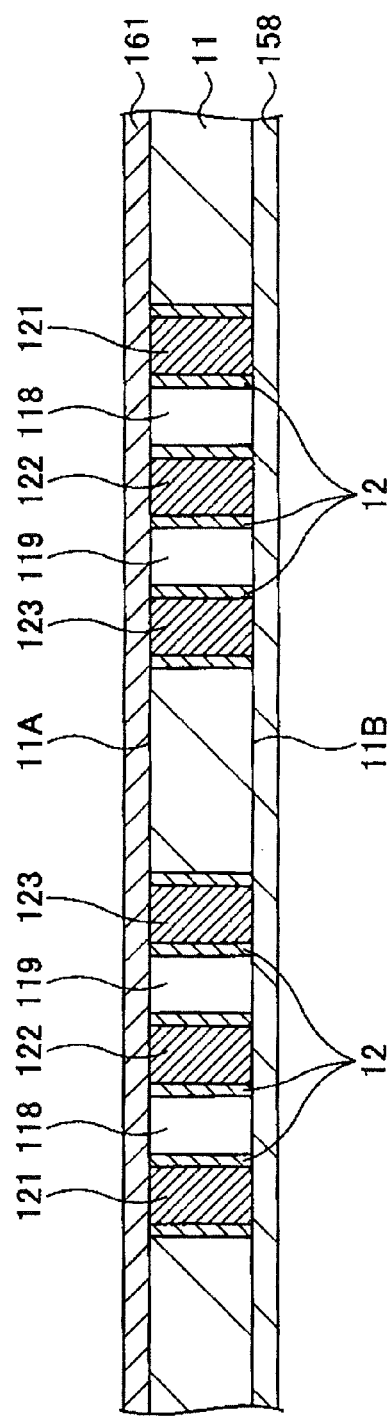
FIG. 33 is a view (No. 8) showing the step of manufacturing the inductor device according to the second embodiment of the invention.
Figure 34:
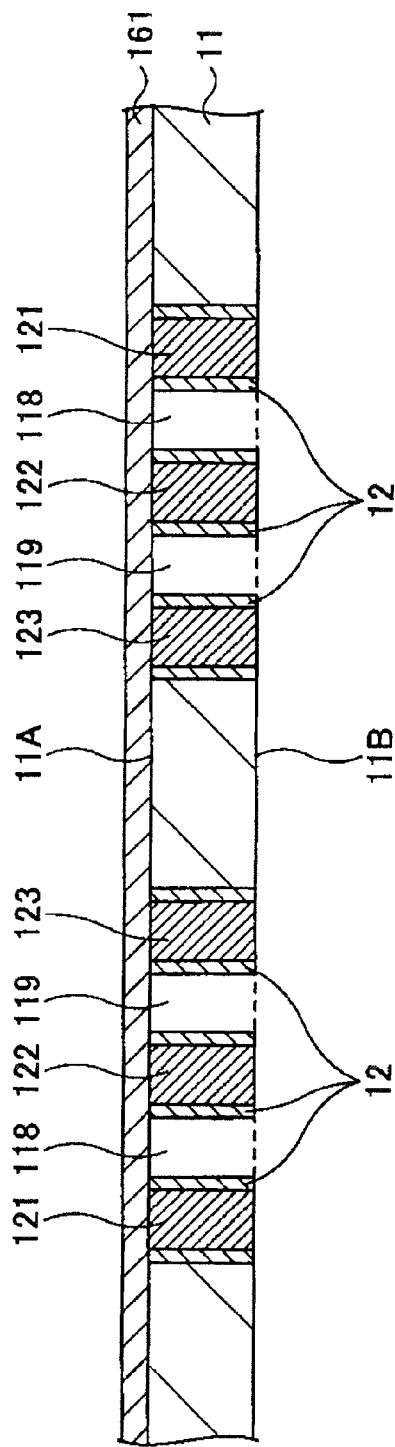
FIG. 34 is a view (No. 9) showing the step of manufacturing the inductor device according to the second embodiment of the invention.

At a step shown in FIG. 34, then, the fixing adhesive sheet 158 provided on the structure shown in FIG. 33 is peeled. At a step shown in FIG. 35, thereafter, the same processings as those of the steps shown in FIGS. 17 and 18 described in the first embodiment are carried out to form second conductive members 124 and 125 in the second penetrating trenches 118 and 119 (a second conductive member forming step). For the second conductive members 124 and 125, it is possible to use a Cu plated film (a second plated film), for example. Moreover, widths of the second conductive members 124 and 125 can be set to be 60 μm, for example.

Thus, the semiconductor substrate 11 in the part disposed between the insulating films 12 (the first insulating films) is subjected to the etching to form the second penetrating trenches 118 and 119 and to form the second conductive members 124 and 125 in the second penetrating trenches 118 and 119 so that the semiconductor substrate 11 is not provided between the first conductive members 121 to 123 and the second conductive members 124 and 125. Therefore, it is possible to reduce the size of the inductor device 110.

By forming the second conductive members 124 and 125 in the second penetrating trenches 118 and 119 penetrating the semiconductor substrate 11, moreover, it is possible to increase the thicknesses of the second conductive members 124 and 125. Therefore, it is possible to suppress the increase in the resistance loss of the inductor device 110.

Figure 35:
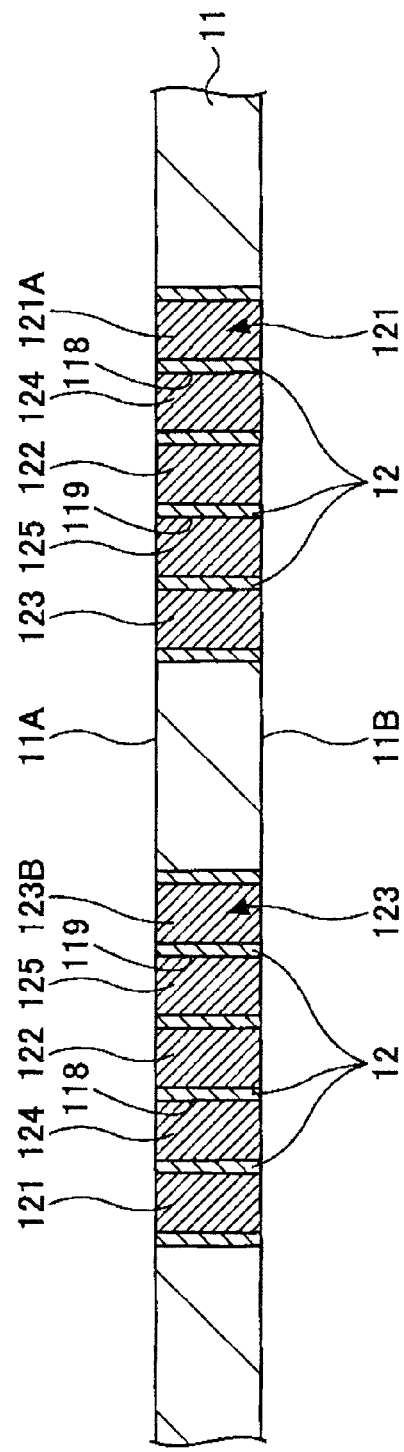
FIG. 35 is a view (No. 10) showing the step of manufacturing the inductor device according to the second embodiment of the invention.
Figure 36:
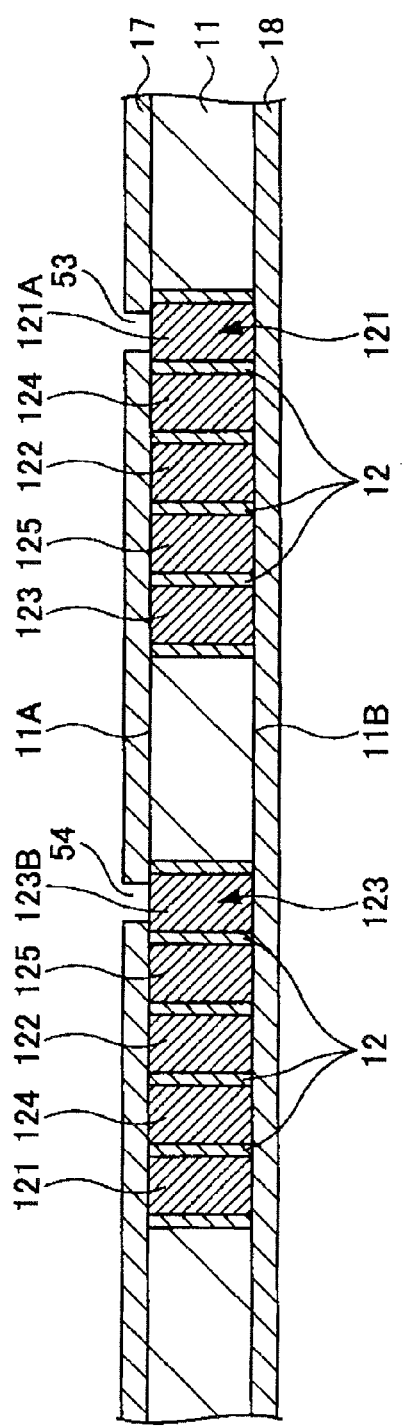
FIG. 36 is a view (No. 11) showing the step of manufacturing the inductor device according to the second embodiment of the invention.

As a step shown in FIG. 36, thereafter, an insulating film 17 having openings 53 and 54 is formed on an upper surface of the structure shown in FIG. 35 and an insulating film 18 is formed on a lower surface of the structure shown in FIG. 35 by the same technique as that in the step shown in FIG. 19 described in the first embodiment. The opening portion 53 is formed to expose a first connecting portion 121A provided in the first conductive member 121 and the opening portion 54 is formed to expose a second connecting portion 123B provided in the first conductive member 123.

At a step shown in FIG. 37, next, wiring patterns 63 and 64 and conductive member connecting wiring patterns 131 to 134 (not shown) are formed on an upper surface of the structure shown in FIG. 37 at the same time by the same technique shown in FIG. 20 described in the first embodiment (for example, a semiadditive method) (a conductive member connecting wiring pattern forming step). Consequently, an inductor body 120 is formed.

Figure 21:
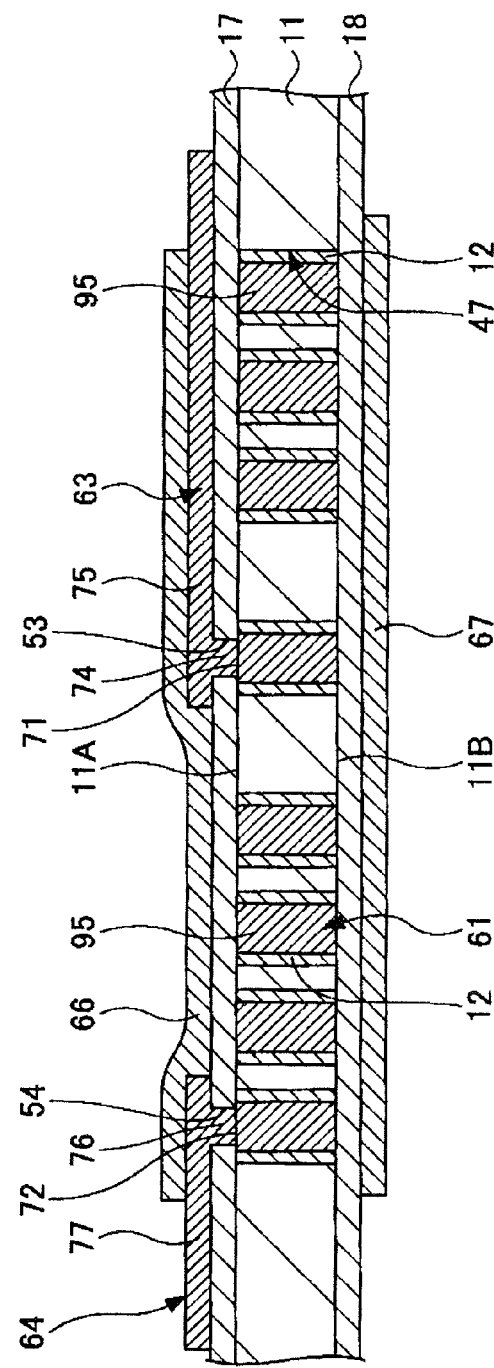
FIG. 21 is a view (No. 10) showing the step of manufacturing the inductor device according to the first embodiment of the invention.

Then, a magnetic body 66 is formed on an upper surface side of the inductor body 120 and a magnetic body 67 is formed on a lower surface side of the inductor body 120 by the same technique as that in the step shown in FIG. 21 described in the first embodiment (for example, a sputtering method) (a magnetic body forming step). Consequently, the inductor device 110 is manufactured. In the case in which a ferrite film is used for the magnetic bodies 66 and 67, thicknesses of the magnetic bodies 66 and 67 can be set to be 0.5 μm to 20 μm, for example.

By forming the magnetic bodies 66 and 67 above and below the inductor body 120, thus, it is possible to increase the value of the inductance of the inductor body 120. Therefore, it is possible to enhance the characteristic of the inductor device 110.

According to the method of manufacturing the inductor device in accordance with the embodiment, the first conductive members 121 to 123 are formed in the first penetrating trenches 114 to 116 in which the insulating film 12 (the first insulating film) is provided, the semiconductor substrate 11 in the portion positioned between the first conductive members 121 and 123 and the first conductive member 122 is then removed to form the second penetrating trenches 118 and 119, and the insulating film 12 (the second insulating film) is thereafter formed on the semiconductor substrate 11 in the corresponding parts to the side surfaces of the second penetrating trenches 118 and 119 in which the insulating film 12 (the first insulating film) is not provided, and the second conductive members 124 and 125 are subsequently formed in the second penetrating trenches 118 and 119 so that the semiconductor substrate 11 is not provided between the first conductive members 121 to 123 and the second conductive members 124 and 125. Consequently, it is possible to reduce the size of the inductor device 110.

Moreover, it is possible to increase the thicknesses of the first and second conductive members 121 to 125. Therefore, it is possible to suppress the increase in the resistance loss of the inductor device 110.

While the preferred embodiments according to the invention have been described above in detail, the invention is not restricted to the specific embodiments but various changes and modifications can be made without departing from the scope of the invention described in the claims.

For example, the inductor body 61 described in the first embodiment may take a circularly spiral shape. Moreover, the inductor body 120 described in the second embodiment may take the circularly spiral shape, for example. Further, the structures of first embodiment and the second embodiment may be combined. For example, the inductor body 61 described in the first embodiment may be constructed by a plurality of first conductive members penetrating the semiconductor substrate and disposed concentrically, a plurality of second conductive members penetrating the semiconductor substrate and disposed concentrically, and a conducive member connecting wiring pattern electrically connecting the first conductive member to the second conductive member which is adjacent to the first conductive member, wherein a structure formed by the first conductive members, the second conductive members and the conductive member connecting wiring pattern takes a spiral shape seen on a plane.

The invention can be applied to an inductor device and a method of manufacturing the inductor device in which a size can be reduced and an increase in a resistance loss can be suppressed.

What is claimed is:

1. An inductor device formed on a semiconductor substrate comprising:
    a plurality of first conductive members formed in first trenches penetrating the semiconductor substrate and disposed concentrically;
    a plurality of second conductive members formed in second trenches penetrating the semiconductor substrate and disposed concentrically;
    an insulating film provided between side surfaces of the first conductive members and side surfaces of the second conductive members and between the side surfaces of the first and second conductive members and the semiconductor substrate;
    an insulating film provided on an upper surface of the semiconductor substrate and on an upper surface of the first and second conductive members;
    an insulating film provided on a lower surface of the semiconductor substrate and on a lower surface of the first and second conductive members; and
    a conducive member connecting wiring pattern electrically connecting the first conductive member to the second conductive member which is adjacent to the first conductive member,
    wherein the first conductive member and the second conductive member are alternately disposed through the insulating film.

2. The inductor device according to claim 1, wherein a structure formed by the first conductive members, the second conductive members and the conductive member connecting wiring pattern takes a spiral shape seen on a plane.

3. The inductor device according to claim 2, further comprising:
    magnetic bodies provided in a vertical direction of the structure respectively.

* * * * *